United States Patent
Murrin et al.

(10) Patent No.: US 10,756,935 B2
(45) Date of Patent: Aug. 25, 2020

(54) GFSK DETECTOR

(71) Applicant: Imagination Technologies Limited, Kings Langley (GB)

(72) Inventors: Paul Murrin, Chepstow (GB); Adrian John Anderson, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 16/547,886

(22) Filed: Aug. 22, 2019

(65) Prior Publication Data

US 2020/0067742 A1    Feb. 27, 2020

(30) Foreign Application Priority Data

Aug. 22, 2018   (GB) .................................. 1813690.3
Aug. 22, 2018   (GB) .................................. 1813692.9

(51) Int. Cl.
     *H04L 27/14*      (2006.01)
     *H04L 27/20*      (2006.01)
     (Continued)

(52) U.S. Cl.
     CPC ............ *H04L 27/14* (2013.01); *H03M 13/23* (2013.01); *H03M 13/256* (2013.01);
     (Continued)

(58) Field of Classification Search
     CPC ... H04L 27/2032; H04L 1/0054; H04L 1/006; H04L 2027/004; H04L 2027/0065; H03M 12/23; H03M 13/256
     See application file for complete search history.

(56) References Cited

U.S. PATENT DOCUMENTS 6,476,739 B1 * 11/2002 Lui ................... H03M 13/4146
                                                       341/107
7,450,668 B2    11/2008   Ghosh et al.
(Continued)

FOREIGN PATENT DOCUMENTS

EP      1901509 A1    3/2008
EP      2434709 A2    3/2012
(Continued)

OTHER PUBLICATIONS

Extended European Search Report dated Jan. 17, 2020 in European Application No. 19192762.3.

*Primary Examiner* — Jaison Joseph
(74) *Attorney, Agent, or Firm* — Potomac Law Group, PLLC; Vincent M DeLuca

(57) ABSTRACT

A Gaussian frequency shift keying (GFSK) detector for decoding a GFSK signal. The detector includes: a multi-symbol detector and a Viterbi decoder. The multi-symbol detector is configured to: receive a series of samples representing a received GFSK modulated signal; and generate, for each set of samples representing an N-symbol sequence of the GFSK modulated signal, a plurality of soft decision values that indicate the probability that the N-symbol sequence is each possible N-symbol pattern, wherein N is an integer greater than or equal to two. The Viterbi decoder is configured to estimate each N-symbol sequence using a Viterbi decoding algorithm wherein the soft decision values for the N-symbol sequence are used as branch metrics in the Viterbi decoding algorithm.

20 Claims, 17 Drawing Sheets

(51) Int. Cl.
*H04L 1/00* (2006.01)
*H03M 13/23* (2006.01)
*H03M 13/25* (2006.01)
*H04L 27/00* (2006.01)

(52) U.S. Cl.
CPC ............ *H04L 1/006* (2013.01); *H04L 1/0054* (2013.01); *H04L 27/2032* (2013.01); *H04L 2027/004* (2013.01); *H04L 2027/0065* (2013.01)

(56) References Cited

U.S. PATENT DOCUMENTS

| | | | |
|---|---|---|---|
| 7,529,323 B2 | 5/2009 | Lui et al. | |
| 2015/0280951 A1* | 10/2015 | Shin | H04L 27/14 375/334 |
| 2017/0180171 A1* | 6/2017 | Hosseini | H04L 27/14 |

FOREIGN PATENT DOCUMENTS

| | | |
|---|---|---|
| JP | 2010-178103 A | 8/2010 |
| WO | 2007/127941 A2 | 11/2007 |

\* cited by examiner

GFSK DETECTOR

BACKGROUND

As is known to those of skill in the art, frequency shift keying (FSK) is a frequency modulation scheme in which digital information is transmitted through discrete frequency changes of a carrier signal. In Gaussian FSK (GFSK), instead of directly modulating the frequency of the carrier signal with the digital data symbols, instantaneously changing the frequency at the beginning of each symbol, the data pulses are filtered with a pulse shaping Gaussian filter prior to modulating the carrier signal. The Gaussian filter smooths the transitions between symbols. GFSK is widely used in low data-rate personal communication standards, such as, but not limited to, Bluetooth® and Bluetooth® Low Energy (LE).

The generation of a GFSK signal is illustrated in FIG. 1. A sequence of rectangular pulses 102 representing a data symbol sequence to be transmitted is provided to a Gaussian filter 104 which generates a pulse-shaped version of the data pulses 106. The pulse-shaped signal 106 is then provided to an FSK modulator 108 which modulates the frequency of a carrier signal to generate a GFSK modulated signal 110. The GFSK modulated signal is then provided to a transmitter back-end system where it is up converted to a transmission frequency and coupled to a transmission antenna for radio frequency (RF) transmission.

Since the RF signal received at a GFSK receiver is typically a distorted version of the signal transmitted by the transmitter due to noise etc. the receiver typically has to estimate the transmitted data symbol sequence from the received signal. An example GFSK receiver 200 is shown in FIG. 2. The GFSK receiver 200 comprises an antenna 202, an RF front-end circuit 204 and a baseband circuit 206. The antenna 202 captures an RF GFSK modulated signal and provides the captured signal to the RF front-end circuit 204. The RF front-end circuit 204 down-converts the signal (e.g. via a down-converter 208) to a complex baseband signal and digitises the complex baseband signal (e.g. via an analog to digital converter (ADC) 210) to generate a series of complex (e.g. IQ) samples that represent the received signal. It will be evident to a person of skill in the art that the RF front-end circuit 204 may additionally comprise other components not shown in FIG. 2 to perform other functions such as channel selection, filtering and automatic gain control.

The IQ samples generated by the RF front-end circuit 204 are provided to the baseband circuit 206 which extracts the original data from the IQ samples. The baseband circuit 206 typically comprises a resample circuit 211 which re-samples the IQ samples generated by the RF front-end circuit 204 for processing by the baseband circuit 206; and a detector 212 which is configured to estimate the transmitted data symbol sequence and output the estimated data symbol sequence. Where the original data was encoded by, for example, an error correction code (ECC) the estimated data symbol sequence may be provided to a decoder 214 which is configured to decode the original data stream from the estimated data symbol sequence. It will be evident to a person of skill in the art that the baseband circuit 206 may additionally comprise other components not shown in FIG. 2 to perform other functions such as, but not limited to, carrier frequency offset (CFO) estimation, and timing estimation.

Traditional GFSK detectors are configured to estimate the data symbol sequence by identifying the instantaneous frequency of each IQ sample and translating the identified instantaneous frequency into a data symbol. Where 1/bit per symbol modulation (i.e. 2-GFSK) is used, this means distinguishing between two frequencies—one that represents a 1 and one that represents a 0. The instantaneous frequency is typically identified by a delay and multiply operation. However, this amplifies the noise which limits the sensitivity that can be achieved with such a detector.

The embodiments described below are provided by way of example only and are not limiting of implementations which solve any or all of the disadvantages of known GFSK detectors and/or receivers.

SUMMARY

This summary is provided to introduce a selection of concepts that are further described below in the detailed description. This summary is not intended to identify key features or essential features of the claimed subject matter, nor is it intended to be used to limit the scope of the claimed subject matter.

Described herein are methods, and Gaussian frequency shift keying (GFSK) detectors, for decoding a GFSK signal. The GFSK detector includes: a multi-symbol detector and a Viterbi decoder. The multi-symbol detector is configured to: receive a series of samples representing a received GFSK modulated signal; and generate, for each set of samples representing an N-symbol sequence of the GFSK modulated signal, a plurality of soft decision values that indicate the probability that the N-symbol sequence is each possible N-symbol pattern, wherein N is an integer greater than or equal to two. The Viterbi decoder is configured to estimate each N-symbol sequence using a Viterbi decoding algorithm wherein the soft decision values for the N-symbol sequence are used as branch metrics in the Viterbi decoding algorithm.

A first aspect provides a Gaussian frequency shift keying "GFSK" detector comprising: a multi-symbol detector configured to: receive a series of samples representing a received GFSK modulated signal; and generate, for each set of samples representing an N-symbol sequence of the GFSK modulated signal, a plurality of soft decision values that indicate the probability that the N-symbol sequence is each possible N-symbol pattern, wherein N is an integer greater than or equal to two; and a Viterbi decoder configured to estimate an M-symbol sequence of the GFSK modulated signal using a Viterbi decoding algorithm wherein the soft decision values for the N-symbol sequences of that M-symbol sequence are used as branch metrics in the Viterbi decoding algorithm, wherein M is an integer greater than N.

A second aspect provides a method of decoding a received GFSK modulated signal at a GFSK receiver, the method comprising: receiving a series of samples representing the received GFSK signal; generating, each symbol period of the GFSK signal, a plurality of soft decision values that indicate the likelihood that a most recent N-symbol sequence of samples is each possible N-symbol pattern, wherein N is an integer greater than or equal to two; and estimating an M-symbol sequence of the GFSK modulated signal using a Viterbi decoding algorithm wherein, each symbol period, at least a portion of the plurality of soft decision values are used as branch metrics of the Viterbi decoding algorithm, wherein M is an integer greater than N.

The GFSK detectors and GFSK receivers may be embodied in hardware on an integrated circuit. There may be provided a method of manufacturing, at an integrated circuit manufacturing system, the GFSK detector or GFSK receiver. There may be provided an integrated circuit definition dataset that, when processed in an integrated circuit manufacturing system, configures the system to manufacture the GFSK detector or GFSK receiver. There may be provided a non-transitory computer readable storage medium having stored thereon a computer readable description of a GFSK detector or a GFSK receiver that, when processed in an integrated circuit manufacturing system, causes the integrated circuit manufacturing system to manufacture an integrated circuit embodying a GFSK detector or a GFSK receiver.

There may be provided an integrated circuit manufacturing system comprising: a non-transitory computer readable storage medium having stored thereon a computer readable description of the GFSK detector or the GFSK receiver; a layout processing system configured to process the computer readable description so as to generate a circuit layout description of an integrated circuit embodying the GFSK detector or the GFSK receiver; and an integrated circuit generation system configured to manufacture the GFSK detector or the GFSK receiver according to the circuit layout description.

There may be provided computer program code for performing a method as described herein. There may be provided non-transitory computer readable storage medium having stored thereon computer readable instructions that, when executed at a computer system, cause the computer system to perform the methods as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
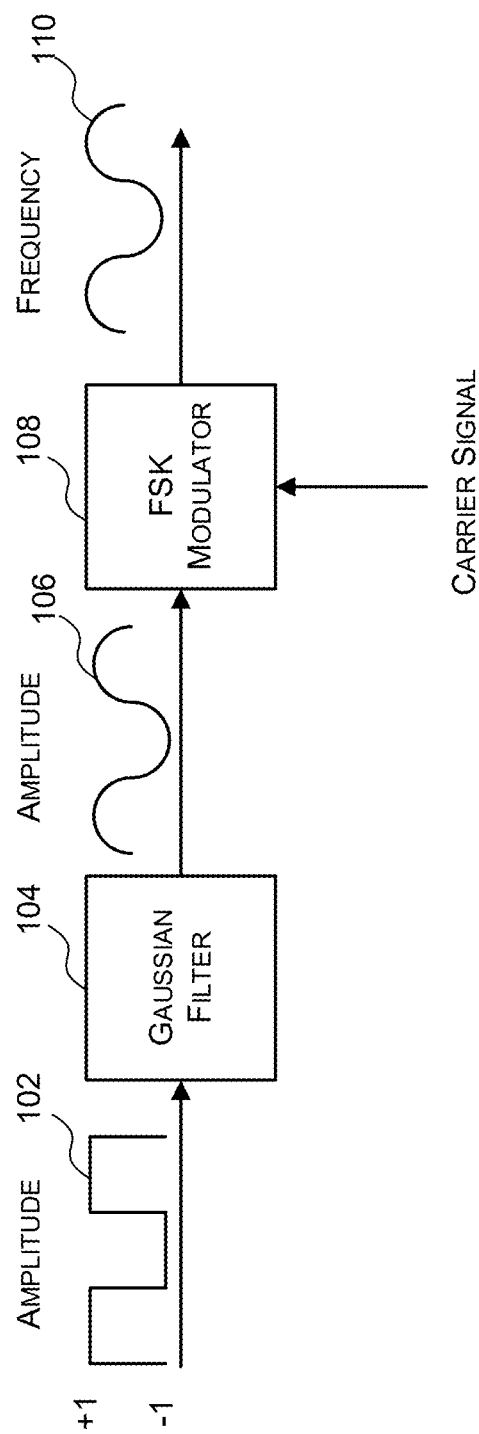
FIG. 1 is a schematic diagram illustrating the generation of a GFSK signal.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

Described herein are GFSK detectors for identifying the symbols of a received GFSK modulated signal that comprise a multi-symbol detector and a Viterbi decoder. The multi-symbol detector is configured to generate a set of soft decision values for each N-symbol sequence of the GFSK modulated signal that indicate the probability that the N-symbol sequence is each of the possible N-symbol patterns wherein N is an integer equal to or greater than two. The Viterbi decoder estimates an M-symbol message (wherein M is an integer greater than N) using a Viterbi decoding algorithm (VDA) in which the soft decision values generated by the multi-symbol detector are used as the branch metrics of the VDA. As the VDA estimates multi-symbol sequences based on the history of received symbols the Viterbi decoder can penalise illegitimate phase transitions detected by the multi-symbol detector. Such a GFSK detector does not amplify the noise and hence can achieve better receiver sensitivity than GFSK detectors which identify symbols of the received GFSK modulated signal through a delay and multiply operation.

While there are detectors, known to the Applicant (which is not an admission that such detectors are known outside of the Applicant company or are well-known), for identifying the symbols of an FSK modulated signal that are configured to use a Viterbi decoder such Viterbi decoders are typically preceded by a single-symbol detector and/or use a different, more complicated mechanism, for calculating the branch metrics that includes channel equalisation, but requires a training sequence. However, using a multi-symbol detector vs a single-symbol detector increases the likelihood that the detector is able to recover the transmitted symbols in the presence of noise. Specifically, it allows the detector to recover missing information, for example, if a symbol is corrupted by impulsive noise (i.e. noise of short duration compared to the symbol rate) as the information in one or more adjacent symbols can be used to recover the lost symbol. Furthermore, where channel equalisation is not required (such as in a Bluetooth® or Bluetooth® LE systems) using the soft decision probability values generated by the multi-symbol detector as the branch metrics in the VDA allows the decoder to be efficiently implemented in hardware yet still produce good performance without requiring a training sequence. Accordingly, the inventors have found that a good trade-off between performance and complexity can be achieved by the GFSK detectors described herein.

Figure 3:
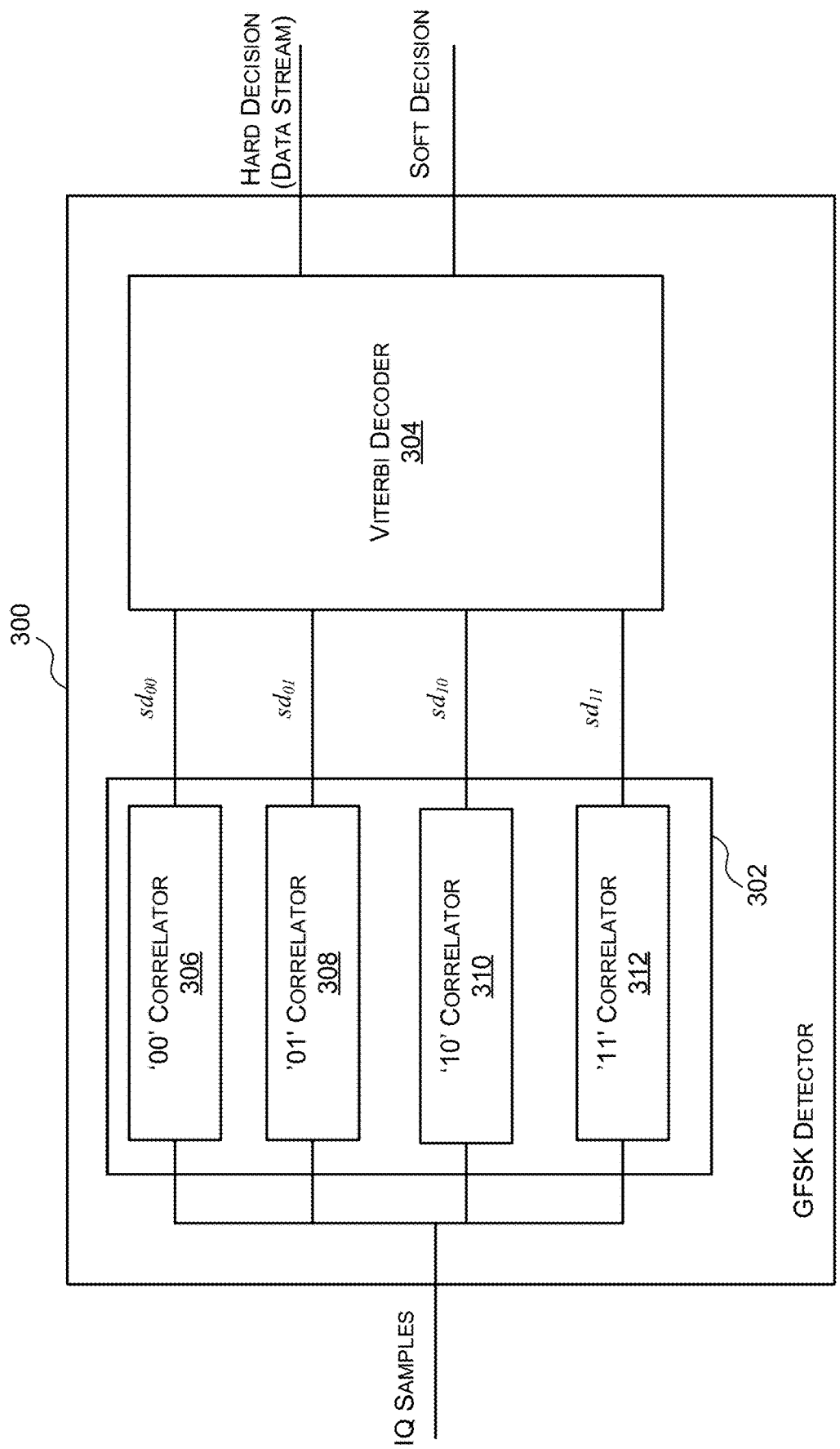
FIG. 3 is a block diagram of an example GFSK detector comprising a multi-symbol detector and a Viterbi decoder.

Reference is now made to FIG. 3 which illustrates a first example GFSK detector 300. The GFSK detector 300 of FIG. 3 comprises a multi-symbol detector 302 and a Viterbi decoder 304.

The multi-symbol detector 302 is configured to receive complex (e.g. IQ) samples representing the received RF GFSK modulated signal and generate, each symbol period, a set of soft decision values that provide an estimate of the likelihood or probability that the most recent N-symbol sequence of samples is each of the possible N-symbol patterns or combinations wherein N is an integer equal to or greater than two. In some cases, the set of soft decision values that are generated each symbol period comprises a soft decision value for each possible N-symbol pattern that indicates the likelihood or probability that the most-recent N-symbol sequence of samples is that N-symbol pattern.

In the example shown in FIG. 3 N is equal to two and each symbol corresponds to a single bit, thus there are four possible two-symbol patterns thus the multi-symbol detector 302 generates four soft decision values $sd_{00}$, $sd_{01}$, $sd_{10}$ and $sd_{11}$ each symbol period. One soft decision value $sd_{00}$ indicates the likelihood or probability that the most recent two-symbol sequence of samples is a '00', one soft decision value $sd_{01}$ indicates the likelihood or probability that the most recent two-symbol sequence of samples is a '01', one soft decision value $sd_{10}$ indicates the likelihood or probability that the most recent two-symbol sequence of samples is a '10' and the final soft decision value $sd_{11}$ indicates the likelihood or probability that the most recent two-symbol sequence of samples is '11'. However, this is an example only and N may be any integer greater than or equal to two.

In some cases, the multi-symbol detector 302 may be configured to generate the soft decision values for the most recent N-symbol sequence of samples by comparing the most recent N-symbol sequence of samples to a plurality of reference patterns that represent each of the possible N-symbol patterns or combinations. For example, the multi-symbol detector 302 of FIG. 3 is formed by $2^N$ correlators 306, 308, 310, 312. Each correlator 306, 308, 310, 312 is configured to correlate N-symbol sequences of samples to a reference pattern that represents one of the possible N-symbol combinations. Each correlator 306, 308, 310, 312 therefore determines the similarity between N-symbol sequences of samples and the corresponding reference pattern.

In the example of FIG. 3 where N is equal to two and each symbol corresponds to a single bit, the first correlator 306 correlates N-symbol sequences of samples to a reference pattern that represents a '00', the second correlator 308 correlates N-symbol sequences of samples to a reference pattern that represents a '01', the third correlator 310 correlates N-symbol sequences of samples to a reference pattern that represents a '10', and the fourth correlator 312 correlates N-symbol sequences of samples to a reference pattern that represents a '11'. Generally, the more similar an N-symbol sequence of IQ samples is to the reference pattern the larger the magnitude of the correlator output. In this manner the output of the correlators can be seen as providing an indication of the probability or likelihood that a N-symbol pattern matches the reference pattern.

Figure 4:
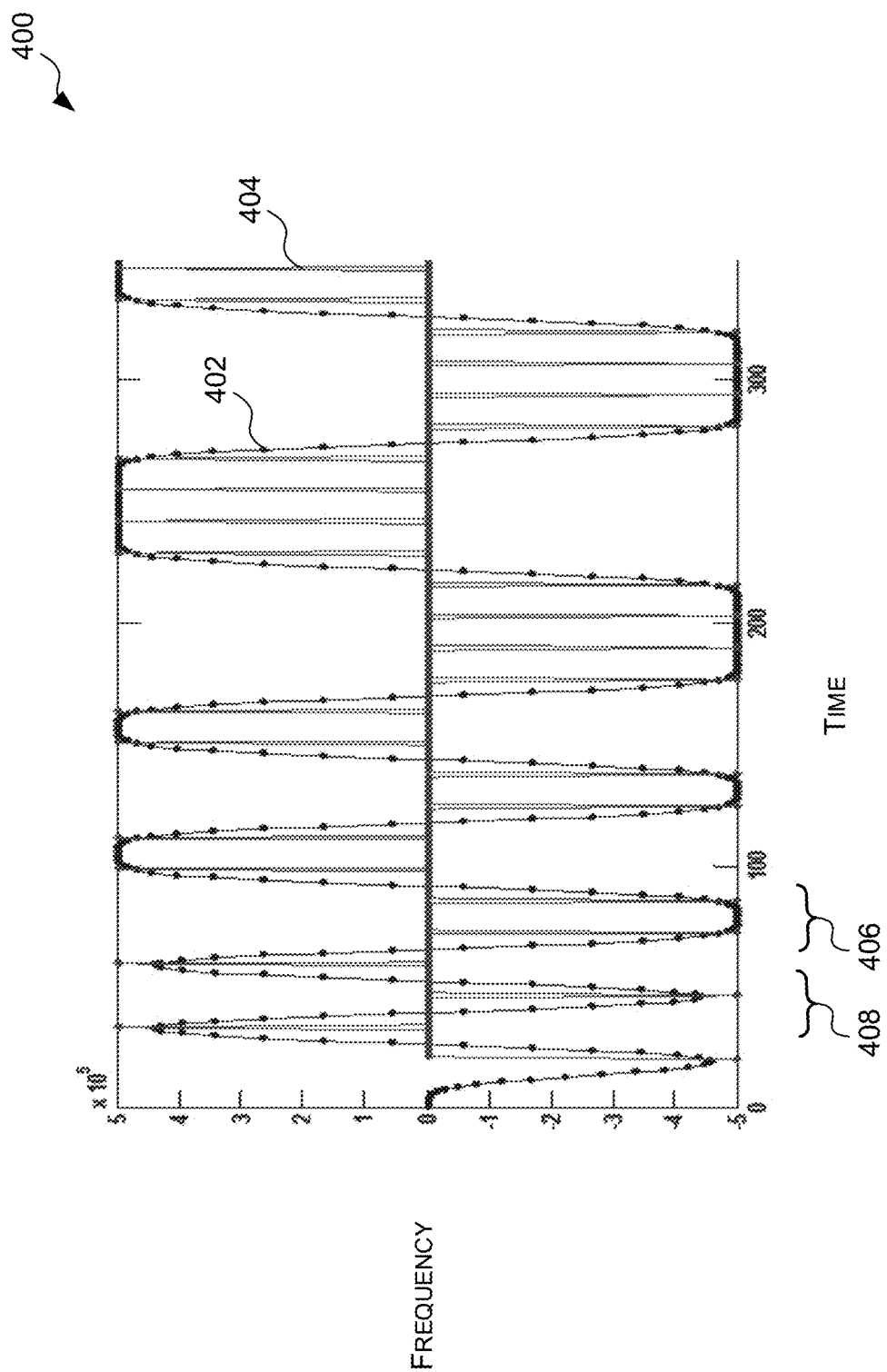
FIG. 4 is a graph illustrating expected frequency transitions for a sequence of symbols.

Each combination or pattern of N symbols will have a different set of phase transitions. For example, FIG. 4 shows a graph 400 that illustrates the expected frequency output 402 for a sequence of symbols 404. Specifically FIG. 4 illustrates the expected frequency output of a symbol sequence of '0101001100110000111100011''. It can be seen from FIG. 4 that the expected frequency transitions for a "00" 406 are distinct from the expected frequency transitions for a '10' 408. Accordingly, combinations of symbols can be identified via the frequency transitions expected thereof. As a result, the reference patterns used by the correlators 306, 308, 310, 312 typically represent the expected frequency or phase transitions for a particular combination of N symbols. An example implementation of a multi-symbol detector 302 will be described with reference to FIG. 5.

While an estimate of the current symbol may be generated from the soft decision values only, the multi-symbol detector 302 does not take into account what the previous symbols were when generating the soft decision values, thus the multi-symbol detector 302 cannot detect illegal transitions—e.g. a transition from a '00' to a '11'. Accordingly, the soft decision values are provided to a Viterbi decoder 304 which uses the soft decision values in combination with history information to more accurately identify the symbols in the received GFSK modulated signal.

Returning to FIG. 3, the Viterbi decoder 304 is configured to estimate the most recent N-symbol sequence based on the soft decision values generated by the multi-symbol detector 302 and the sequence of previous symbols. Specifically, the Viterbi decoder 304 is configured to trace the most likely path through the trellis of valid N-symbol transitions based on the soft decision values received from the multi-symbol detector 302. As is known to those of skill in the art, a trellis is a graph that links the states at multiple points in time via valid transitions between states. The Viterbi decoder 304 of FIG. 3 is configured to track the transitions between N-symbol sequences.

Figure 5:
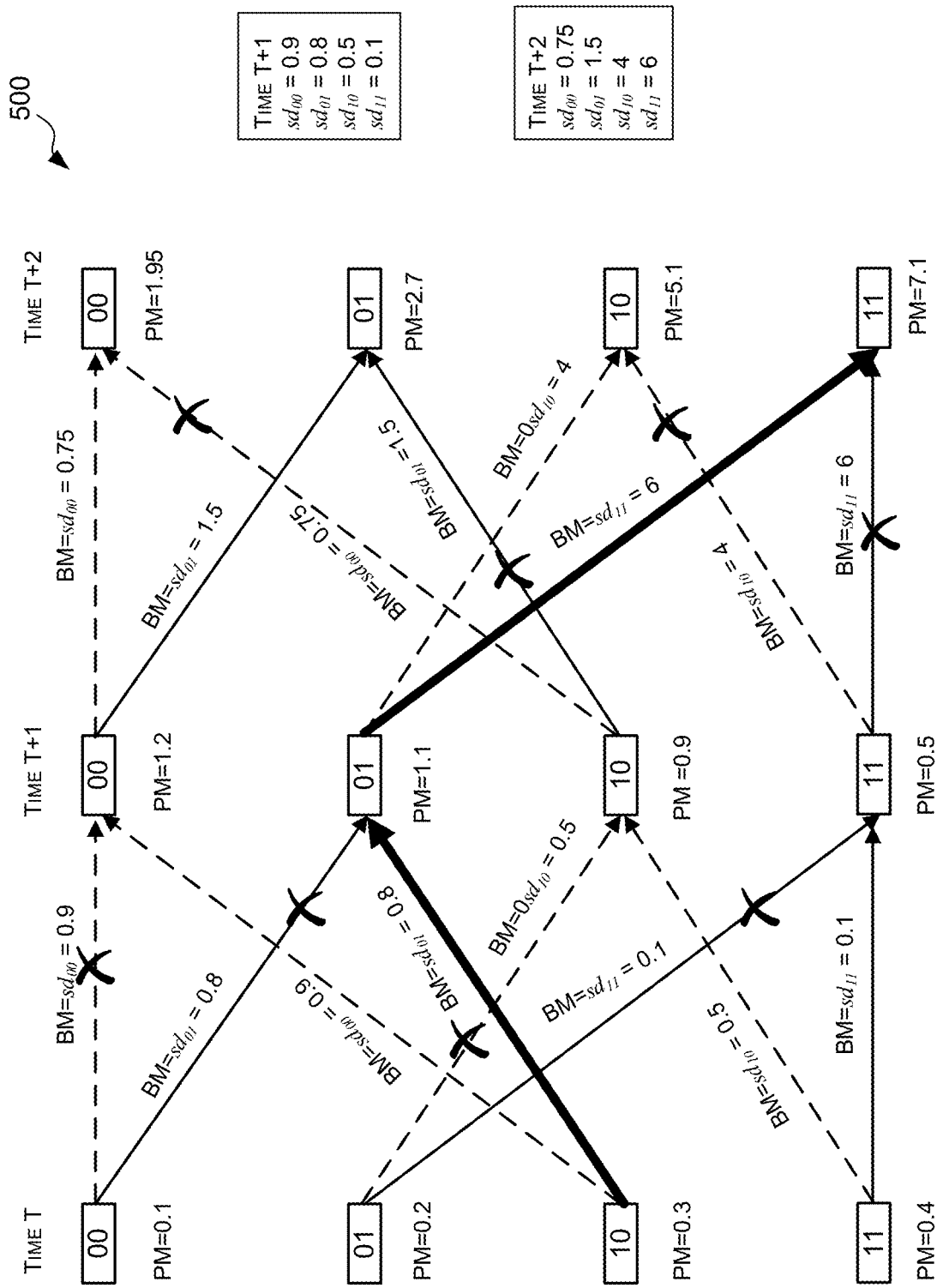
FIG. 5 is a schematic diagram of an example Viterbi decoder trellis.

An example trellis diagram 500 to track transitions between consecutive two-symbol sequences (i.e. N=2) is illustrated in FIG. 5 wherein each symbol corresponds to a single bit (i.e. '0' or '1'). In this example, at any point in time the two-symbol sequence will be in one of the following states—'00', '01', '10' or '11' where in this example the state code corresponds to the bit sequence transmitted. Each branch or link in the trellis corresponds to a valid sequence or transition—i.e. a valid transition from a first two-symbol sequence to a second two-symbol sequence wherein the last bit of the first two-symbol sequence is the first bit of the second two-symbol sequence. A branch that results from the next symbol being a '0' is shown as a dotted line and a branch that results from the next symbol being a '1' is shown as a solid line. It can be seen that in this example there are only two valid transitions from each state—one when the next symbol is a '0' and one when the next symbol is a '1'. For example, it is possible to transition from the '00' state to the '01' or '00' state, but it not possible to transition from the '00' state to the '10' or '11' state. Accordingly, any valid sequence of symbols can be represented as a path through the trellis diagram 500. The Viterbi decoder 304 is configured to identify the path through the trellis diagram which is the closest match to the received symbol sequence (i.e. the maximum likelihood sequence) using the Viterbi decoding algorithm (VDA).

The VDA also specifies that the path through the trellis diagram which is the closest match to the received symbol sequence can be identified by associating each branch between a state at time X and a state at time X+1 with a branch metric (BM) that indicates the likelihood that the state at time X+1 occurred after the state at time X, generating a path metric (which may also be referred to as the state metric) for each path based on the branch metrics along the path, and selecting the path with the best path metric. In some cases, the path metric may be the sum of the branch metrics along a path. However, in other cases the path metric may be generated from the branch metrics in another manner.

In the Viterbi decoder 304 of FIG. 3 the soft decision values $sd_{00}$, $sd_{01}$, $sd_{10}$ and $sd_{11}$ received from the multi-symbol detector 302 for time T are used as the branch metrics (BMs) for transitions from time T−1 to time T. Specifically, the soft decision value for a particular N-symbol sequence is used as the branch metric for any branch that terminates in that N-symbol sequence. For example, as shown in FIG. 5 the soft decision value $sd_{00}$ which indicates the likelihood that the most recent two-symbol sequence is a '00' is used as the branch metric for the branch that represents a transition from the '00' state to the '00' state, and for the branch the represents a transition from the '10' state to the '00' state. Similarly, the soft decision value $sd_{10}$ which indicates the likelihood that the most recent two-symbol sequence is a '10' is used as the branch metric for the branch that represents a transition from the '01' state to the '10' state and for the branch that represents a transition from the '11' state to the '10' state.

Furthermore, according to the VDA if any two distinct paths along the trellis merge to a single state, one of them can always be eliminated in the search for an optimum path. The trellis diagram can then be 'pruned' of those paths that are unlikely to have been sent.

In some cases, the trellis diagram may be 'pruned' by calculating, each transition from a state at time T to a state at time T+1 (i.e. each symbol period), the path metric for a path according to each branch from the previous state to the current state. In some cases, the path metric may be equal to the sum of the path metric associated with the state at time T (i.e. the sum of the branch metrics to get to the state at time T) and the branch metric to transition to the state at time T+1. Then if multiple branches merge to a single state, the branch with the best path metric is selected and the other branch is discarded. The path metric of the selected branch then becomes the path metric associated with that state at time T+1. In some cases, the highest branch metric is considered to be the 'best' branch metric.

For example, referring to the trellis diagram 500 of FIG. 5 there are two branches (a top or upper branch and a bottom or lower branch) that merge to state 00 at time T+1 which have path metrics 1.0 and 1.2 respectively. Since the path metric associated with the bottom or lower branch is greater than the path metric associated with the top or upper branch, the bottom branch is selected, and the top branch is discarded. The path metric associated with the bottom branch then becomes the path metric of state '00' at time T+1 (i.e. the path metric of state '00' at time T+1 is set to 1.2). In the trellis diagram 500 of FIG. 5 the branches that have been 'discarded' are marked with an "X". The steps of generating the path metrics from the soft decision values generated by the multi-symbol detector 302 and selecting the best path metric for each state are repeated each symbol period.

Where the soft decision value for a particular N-symbol sequence is used as the branch metric for any branch that terminates in that N-symbol sequence then the only difference in the path metrics for a path that terminates in that particular N-symbol sequence will be the starting path metrics. Accordingly, in some cases the 'pruning' of the trellis diagram may be simplified by, for each case where multiple branches merge to a particular state, selecting the branch with the best starting path metric (i.e. the path metric for the previous state) and discarding any other branches, and only calculating the path metric for the particular state as the sum of the path metric of the selected path and the branch metric (i.e. the soft decision value for that state). This can simplify the Viterbi decoder implementation as the Viterbi decoder does not need to calculate the path metric for the discarded branches.

The path that is most likely to match the received path at any time is the path beginning with the state with the best (e.g. highest) path metric. For example, in the example of FIG. 5 at time T+1 the state with the highest path metric is state '00' thus the path that is most likely to match the received sequence is the path that starts at state '10' and ends in state '00'—based on the dotted and dashed lines of the branches of this path it can be seen that this means the estimated symbol at time T+1 is "0". At time T+2 the state with the highest path metric is state '11' thus the path that is most likely to match the received sequence is the path that starts at '10', goes to '01' and ends in state '11'—based on the dotted and dashed lines it can be seen that this means the estimated sequence is "1011".

An example implementation of the Viterbi decoder 304 is described below with reference to FIG. 7 and an example identification of the path on the trellis diagram that is the closest match to the received sequence is described below with reference to FIGS. 8 to 10.

Generally, the larger N the more accurate the soft decision values, but the more complex the decoder becomes. Specifically, as N increases the number of correlators increases and the number of states that are tracked by the Viterbi decoder also increases. The Applicant has determined that N=4 can provide a good trade-off between accuracy and complexity, especially for low data-rate personal communication standards, such as, but not limited to, Bluetooth® and Bluetooth® LE.

Figure 6:
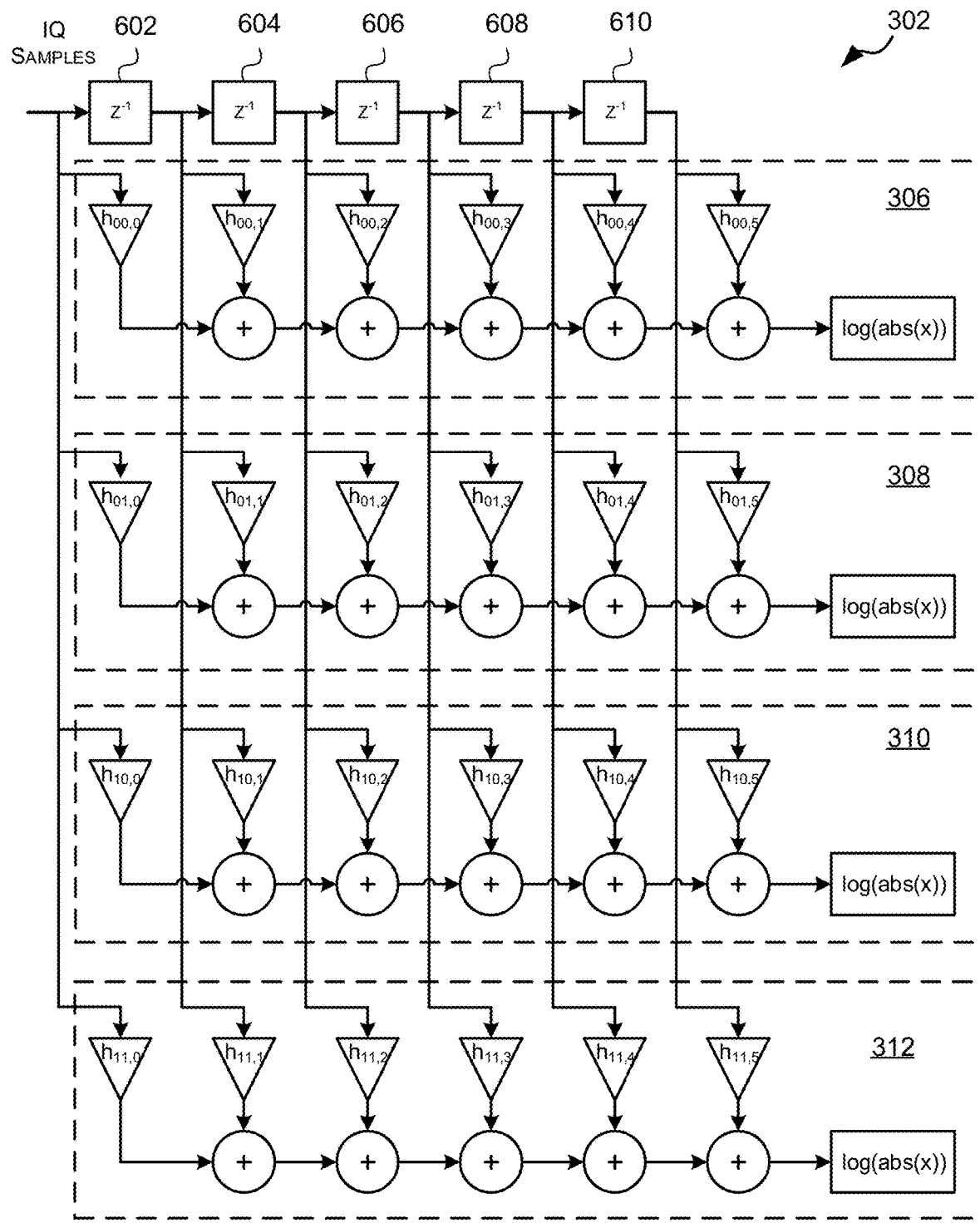
FIG. 6 is a block diagram of an example implementation of the multi-symbol detector of FIG. 3.

Reference is now made to FIG. 6 which illustrates an example implementation of a multi-symbol detector 302 that comprises a plurality of correlators 306, 308, 310, 312. The multi-symbol detector 302 of FIG. 6 comprises a chain of delay units 602, 604, 606, 608, 610 which receive the complex (e.g. IQ) samples generated by, for example, the RF front end circuit and each sample period provide the most recent X samples to the correlators 306, 308, 310, 312 wherein X is K*N where K is the number of samples per symbol and N is the number of symbols in each reference pattern. Specifically, each delay unit 602, 604, 606, 608, 610 in the chain stores a sample of the complex sample stream for one sample period and outputs the stored sample to the next delay unit.

There will be at least one sample per symbol, but there may be more than one sample per symbol. Where there is more than one sample per symbol the received GFSK signal is said to be oversampled. In the example of FIG. 6 the multi-symbol detector 302 is configured to detect two-symbol patterns (i.e. N=2) and the input signal is oversampled by a factor of three so that there are three samples per symbol (i.e. K=3). Therefore in the example of FIG. 6 six samples are provided to the correlators 306, 308, 310, 312 each sample period (i.e. X=N*K=6)—the five previously received samples stored in the delay units 602, 604, 606, 608, 610 and the sample received in the current sample period.

Each correlator 306, 308, 310, 312 is configured to correlate N symbols worth of samples with a reference pattern that corresponds to one combination or pattern of N adjacent symbols. Specifically, each sample period, each correlator (which also may be described as a matched filter) 306, 308, 310, 312 compares the received samples from the delay units 602, 604, 606, 608, 610 with the reference pattern and outputs a metric that indicates how well the set of samples matches the reference pattern. The metric indicates the likelihood or probability that the set of samples correspond to, or match, the particular N-symbol combination pattern.

In the example of FIG. 6 each correlator 306, 308, 310, 312 comprises X amplifiers, X−1 complex addition units and a logarithmic unit. Each amplifier multiplies one of the received samples by a complex coefficient h that represents the $i^{th}$ sample of the reference pattern. Specifically the $i^{th}$ amplifier multiplies the $i^{th}$ sample by the $i^{th}$ coefficient. For example, if the six amplifiers of a correlator 306, 308, 310 or 312 are numbered 0 to 5 the amplifier 0 multiplies sample 0 by coefficient 0 $h_0$, amplifier 1 multiplies sample 1 by coefficient 1 $h_1$ and so on. The addition units sum the outputs of the amplifiers to generate a sum of products. The sum of products is then provided to the logarithmic unit which calculates the log of the magnitude of the sum of products. The result of the log calculation is then output as a soft decision value that indicates the similarity of the received set of samples and the reference pattern. The output can be understood as a probability that the received samples correspond to the specific N-symbol combination that the reference pattern represents. Accordingly, the soft decision value may also be referred to as the similarity metric, the probability metric or the likelihood metric. Generally, the higher the soft decision value the more likely the received samples correspond to the specific N-symbol combination, and the lower the soft decision value the less likely the received samples correspond to the specific N-symbol combination.

In the example of FIG. 6 each correlator 306, 308, 310, 312 generates a soft decision value each sample period. Since the received signal is over sampled by a factor of three this means that each correlator 306, 308, 310, 312 will output three soft decision values per symbol. In some cases, the Viterbi decoder 304 may be configured to operate at the symbol rate instead of the sample rate. In these cases, every three soft decision values may be combined (e.g. the sum, average or mean of the three soft decision values may be generated) to generate a single soft decision value per symbol period which is provided to the Viterbi decoder 304. In other cases, as described in more detail below with respect to FIGS. 13 to 16, only every third soft decision value may be provided to the Viterbi decoder 304 and the other soft decision values may be used for timing recovery. In other examples each correlator may only be configured to output a soft decision value each symbol period. In these cases the delay units may be configured to only provide a set of samples to the correlators every K samples where K is the number of samples per symbol.

The coefficients defining each reference pattern may be obtained by generating a reference GFSK modulated signal based on each combination of N-symbols and sampling the time domain GFSK modulated signal at the sample rate and storing the sample values as the coefficients of the corresponding correlator. The reference patterns may be generated from signals that comprise more than N symbols so as to take into account the spread of the Gaussian pulse shaping filter from previous and subsequent symbols.

Although the multi-symbol detector 302 of FIG. 6 comprises a logarithmic unit that calculates the log of the magnitude of the sum of products, in other example multi-symbol detectors the logarithmic unit may be replaced with a magnitude unit which is configured to output the magnitude of the sum of the products. The inventors have identified that this change simplifies the multi-symbol detector with only minimal loss in performance when used to detect Bluetooth®, Bluetooth® Low Energy (LE) or the like signals.

Figure 7:
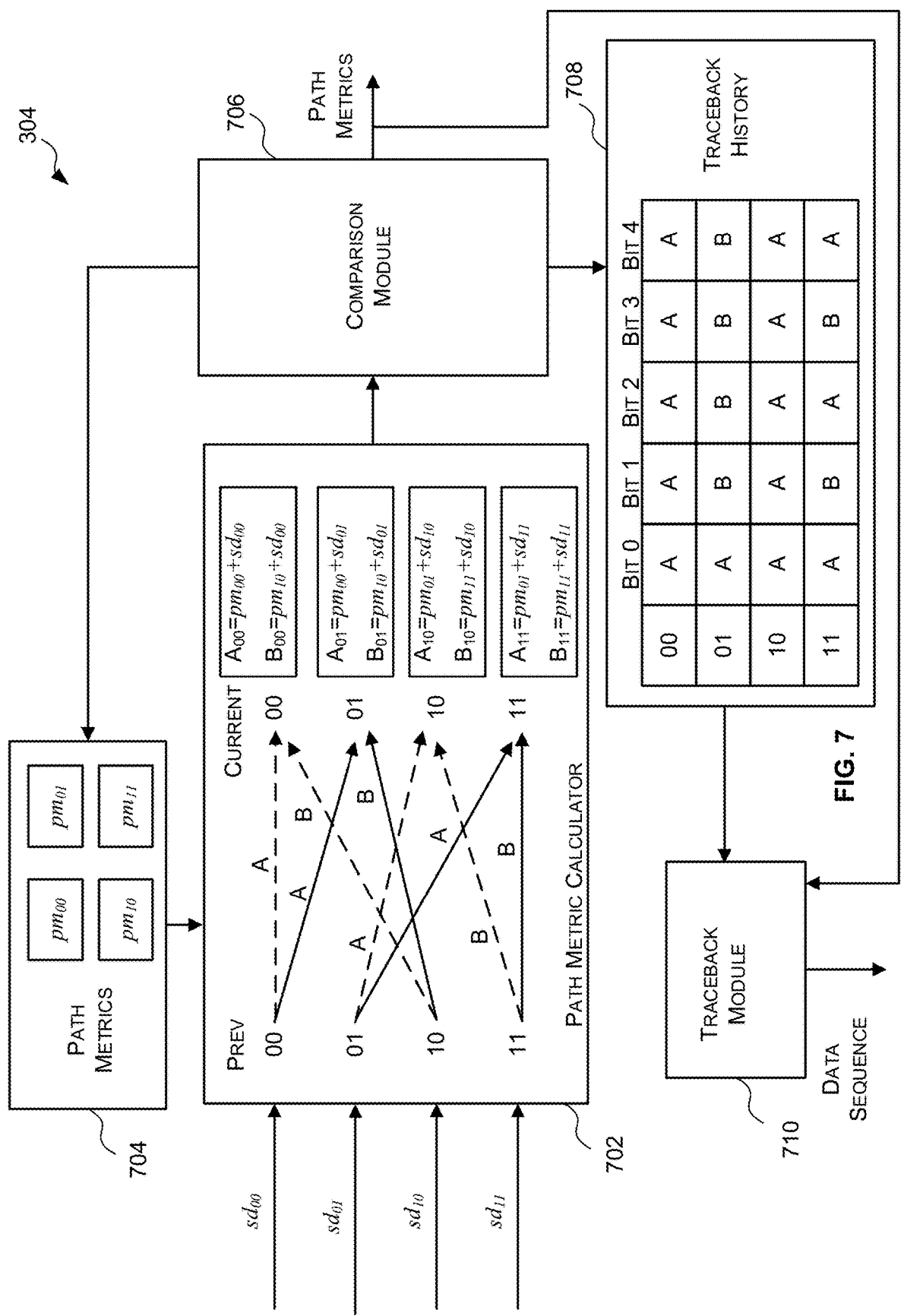
FIG. 7 is a block diagram of an example implementation of the Viterbi decoder of FIG. 3.

Reference is now made to FIG. 7 which illustrates an example implementation of the Viterbi decoder 304 of FIG. 3. As described above with respect to FIG. 3, the Viterbi decoder 304 is configured to trace the most likely path through the trellis of valid N-symbol combination transitions (such as the trellis diagram 500 of FIG. 5) based on the soft decision values received from the multi-symbol detector 302 according to the Viterbi decoding algorithm (VDA). As described above, according to the VDA the path through the trellis diagram which is the closest match to the received symbol sequence is identified by associating each branch between a state at time X and a state at time X+1 with a branch metric (BM) that indicates the likelihood that the state at time X+1 occurred after the state at time X, generating a path metric (which also may be referred to as the state metric) for each path based on the branch metrics along that path, and selecting the path with the best path metric. Furthermore, according to the VDA the number of possible paths to evaluate can be reduced at each stage by, identifying any paths that merge to a single state in that stage, and where a plurality of paths merge to a single state selecting only the path with the best path metric to date and eliminating all other paths.

The Viterbi decoder 304 of FIG. 3 comprises a path metric calculator 702, a path metrics storage unit 704, a comparison module 706, a traceback history storage unit 708, and a traceback module 710.

The path metric calculator 702 is configured to calculate, each symbol period, a path metric for each valid path from a previous state to a current state. The number of possible previous states and the number of possible current states is based on the number of symbols N in the reference patterns of the multi-symbol detector 302. Specifically, there will be $2^N$ different combinations of N-symbols and thus $2^N$ different states. For example, if there are two symbols in each reference pattern (i.e. N=2) and there is one bit per symbol then there will be four possible states: '00', '01', '10', and '11'. There will be a limited number of states which each state can transition into. These are referred to as the valid state transitions. The valid state transitions from the previous state to the current state are shown in FIG. 7 by arrows. For example, the state '00' can transition into the state '00' or '01', but the state '00' cannot transition into the state '10' or the state '11'. Each valid transition from a previous state to the current state is said to be a branch from the previous state to the current state.

For each valid transition from a previous state to a current state the path metric calculator 702 calculates a path metric $A_{ij}$ or $B_{ij}$ that represents the likelihood that a path comprising the previous state and the current state is the correct state. Each possible current state will be reachable via multiple branches (i.e. via multiple previous states). Specifically, in the example of FIG. 7 each current state can be reached via two branches (i.e. via two previous states). An upper branch which is labelled the 'A' branch and a lower branch which is labelled the 'B' branch. The notation $A_{ij}$ is used herein to denote the path metric for the upper path terminating in the state ij and $B_{ij}$ is used herein to denote the path metric for the lower path terminating in the state ij where i,j may be 0 or 1. It will be evident to a person of skill in the art that the terms upper branch and lower branch are simply used to distinguish the two branches that terminate in a particular state and the states may be arranged in another manner such that, for example, one or more of the lower branches becomes an upper branch.

The path metric calculator 702 (which may be implemented by digital logic circuitry) is configured to calculate the path metric for each valid transition based on the path metric of the previous state (wherein the path metric of the previous state represents the probability that the path terminating in the previous state is the correct path (i.e. the most likely path) based on the symbols received so far) and the branch metric for the branch to transition from the previous state to the current state. The path metrics associated with the previous states may be stored in the path metrics storage unit 704. The path metrics storage unit 704 may be any suitable component or set of components for storing digital information such as, but not limited to, a register (or set of registers) or a memory unit such as RAM.

The notation $pm_{ij}$ is used herein to denote the path metric associated with state ij. As described above with respect to FIG. 5 the branch metric represents the probability or likelihood that there has been a transition from the previous state to the current state. Also, as described above, the Viterbi decoders described herein are configured to use the soft decision values output by the multi-symbol decoder as the branch metrics. Specifically, the Viterbi decoders described herein are configured to use the soft decision value $sd_{ij}$ as the branch metric for any branch terminating in the state ij.

In some cases, the path metric calculator 702 may be configured to calculate the path metric for each valid path as the sum of the path metric of the previous state and the branch metric to transition from the previous state to the current state (i.e. soft decision for the terminating state). For example, for two-symbol pattern detection the path metric calculator 702 may be configured to calculate the path metrics for the eight branches using equations (1) to (8):

$$A_{00}=pm_{00}+sd_{00} \qquad (1)$$

$$B_{00}=pm_{10}+sd_{00} \qquad (2)$$

$$A_{01}=pm_{00}+sd_{01} \qquad (3)$$

$$B_{01}=pm_{10}+sd_{01} \qquad (4)$$

$$A_{10}=pm_{01}+sd_{10} \qquad (5)$$

$$B_{10}=pm_{11}+sd_{10} \qquad (6)$$

$$A_{11}=pm_{01}+sd_{11} \qquad (7)$$

$$B_{11}=pm_{11}+sd_{11} \qquad (8)$$

As described above, each current state will be reachable via multiple branches from the previous state. The comparison module 706 is configured to select, for each current state the associated branch that has the 'best' path metric and discard any other associated branches. What denotes the 'best' path metric may depend on how the path metric is calculated and/or how the branch metrics/soft decision values are calculated. Generally, the 'best' path metric is the path metric that indicates a higher probability of the path being the 'correct' path (i.e. the path that matches the received sequence of symbols). In some cases, the 'best' path metric may be the largest path metric. It will be evident to a person of skill in the art, that this is an example only and the 'best' path metric may be selected in another manner.

The path metric of the selected branch for each current state is then stored in the path metrics storage unit 704 as the new path metric for that state.

In some cases, the path metrics storage unit 704 may have a limited amount of storage for storing the path metrics. In some cases, each path metric may be stored as an R-bit unsigned floating point number where R is an integer greater than or equal to two. For example, where R is 8 the path metrics may be stored as unsigned floating point numbers in the range 0 to 3.9844. Since the path metrics continually grow as more symbols are received (since the new branch metrics are added thereto) the path metrics can easily exceed the largest representable number. In some cases, to address this issue the comparison module 706 may be configured to detect if any of the selected path metrics exceed a first predetermined value (e.g. 2.0 when 8-bit unsigned numbers are used) and if at least one of the selected path metrics exceeds the first predetermined value to subtract a second predetermined value (e.g. 1.0 in some cases) from all of the selected path metrics before storing the path metrics in the path metrics storage unit 704. In some cases, if the subtraction would result in a negative path metric the comparison module 706 is configured to set such a path metric to zero. In other cases, the monitoring of the path metrics may be accomplished by the path metric calculator 702 before providing the path metrics to the comparison module 706.

The comparison module 706 also stores an indication of the selected branch for each current state in the traceback history storage unit 708. The traceback history storage unit 708 may be any component for storing digital information, such as, but not limited to, one or more registers and or a memory unit, such as, but not limited to, random access memory (RAM). Specifically, instead of having to store the entire trellis, the traceback history storage unit 708 is configured to store, for a predetermined number of symbols M, the selected branch for each state. For example, in FIG. 7 the traceback history storage unit 708 is configured to store an 'A' to indicate that the upper or 'A' branch was selected and a 'B' to indicate that the lower or 'B' branch was selected. Although the traceback history storage unit 708 shows A's and B's, in other examples a single bit may be used to indicate the selected path. For example a 0 may indicate the upper path was selected and a 1 may indicate that the lower path was selected.

Recording the selected branch for each current state effectively records how the current state was arrived at (i.e. which previous state preceded the current state). This history allows the traceback module 710 to recover the best path through the trellis and translate the best path through the trellis to an estimate of the sequence of received symbols. The depth M of the traceback history may be any suitable length, but is typically the message length. Typically the longer the traceback history the more immune to noise in the middle of the sequence the decoder becomes. While many Viterbi decoders have a traceback depth M greater than or equal to 80, the Applicant has identified that a traceback history of 10 provides a suitable balance, particularly, for low data-rate personal communication standards, such as, but not limited to, Bluetooth® and Bluetooth® Low Energy (LE).

Figure 2:
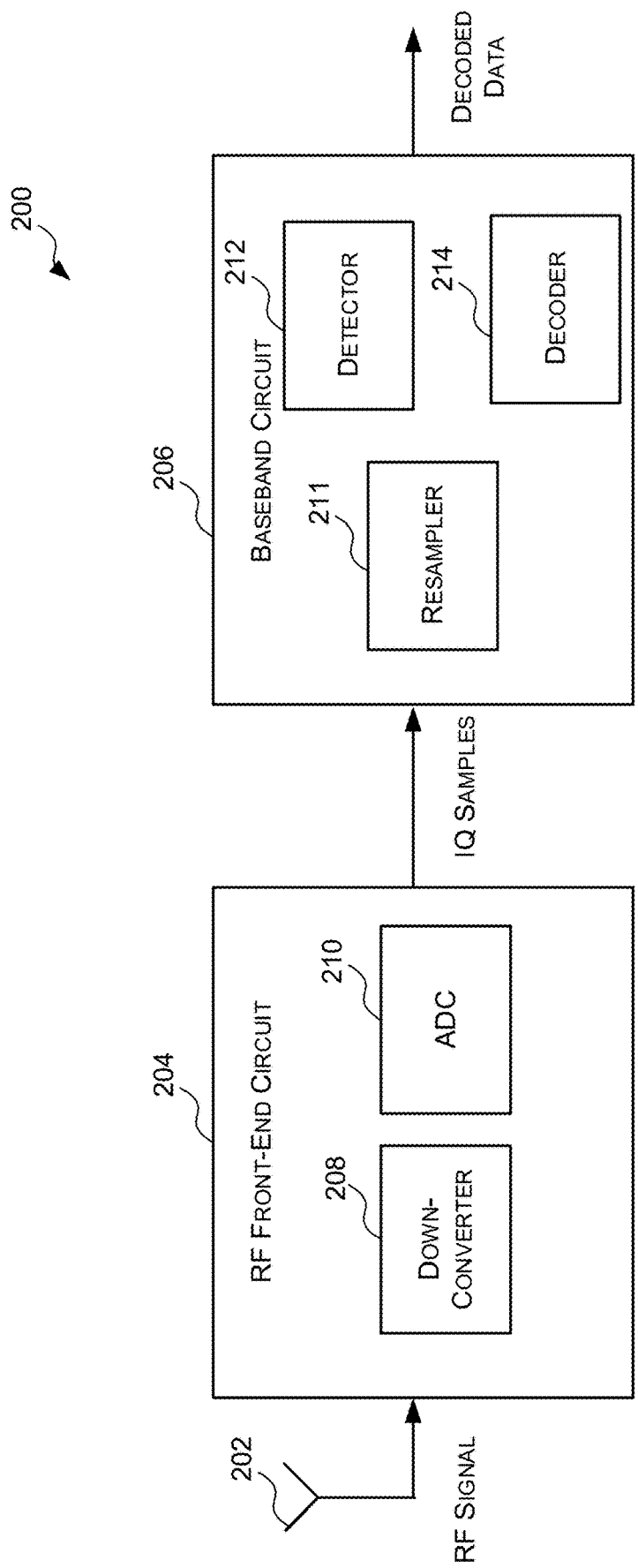
FIG. 2 is a block diagram of an example GFSK receiver.

In some cases, once the selected branches have been recorded in the traceback history storage unit 708 for M symbols the traceback module traces the best path through the trellis starting with the current state with the best path metric. An estimate of the most likely M-symbol stream is then generated from the best path. An example of how the estimated symbol stream may be generated by the traceback module 710 from the data in the traceback history storage unit 708 is described below with reference to FIG. 11. The most likely symbol/bit stream is then output for further processing. For example, as described above with respect to FIG. 2, where the original data stream was encoded using an encoding scheme, such as a forward error correction (FEC) encoding scheme the symbol/bit stream may be provided to a decoder for decoding. In some cases, once the most likely symbol/bit stream is output the traceback history storage unit 708 may be cleared. In other cases, the traceback history storage unit 708 may simply be overwritten with the next M sets of path metrics.

In other cases, a partial traceback scheme may be implemented where M is smaller than the full message depth. This scheme can achieve good performance whilst minimising the traceback history storage unit 708 depth. The partial traceback scheme performs the traceback as described with respect to FIG. 11 from the state with the best path metric over all M symbols, but rather than the traceback module 710 outputting all M bits the traceback module only outputs the M/2 bits from the oldest M/2 entries or elements of the traceback history storage unit 708. These oldest M/2 entries or elements of the traceback history storage module are subsequently cleared leaving the M/2 newest entries or elements of the traceback history storage unit 708. The forward pass of the VDA is then implemented for the next M/2 symbols refilling the traceback history storage unit 708 in a circular fashion. Once the traceback history storage unit 708 is full the partial traceback process is triggered again and this sequence continues until the end of the message where a full traceback can be performed.

In some cases, the comparison module 706 may also be configured to output the current path metrics so that they can be used by downstream components. An example of the use of the path metrics is described below with reference to FIGS. 14 to 16.

Figure 8:
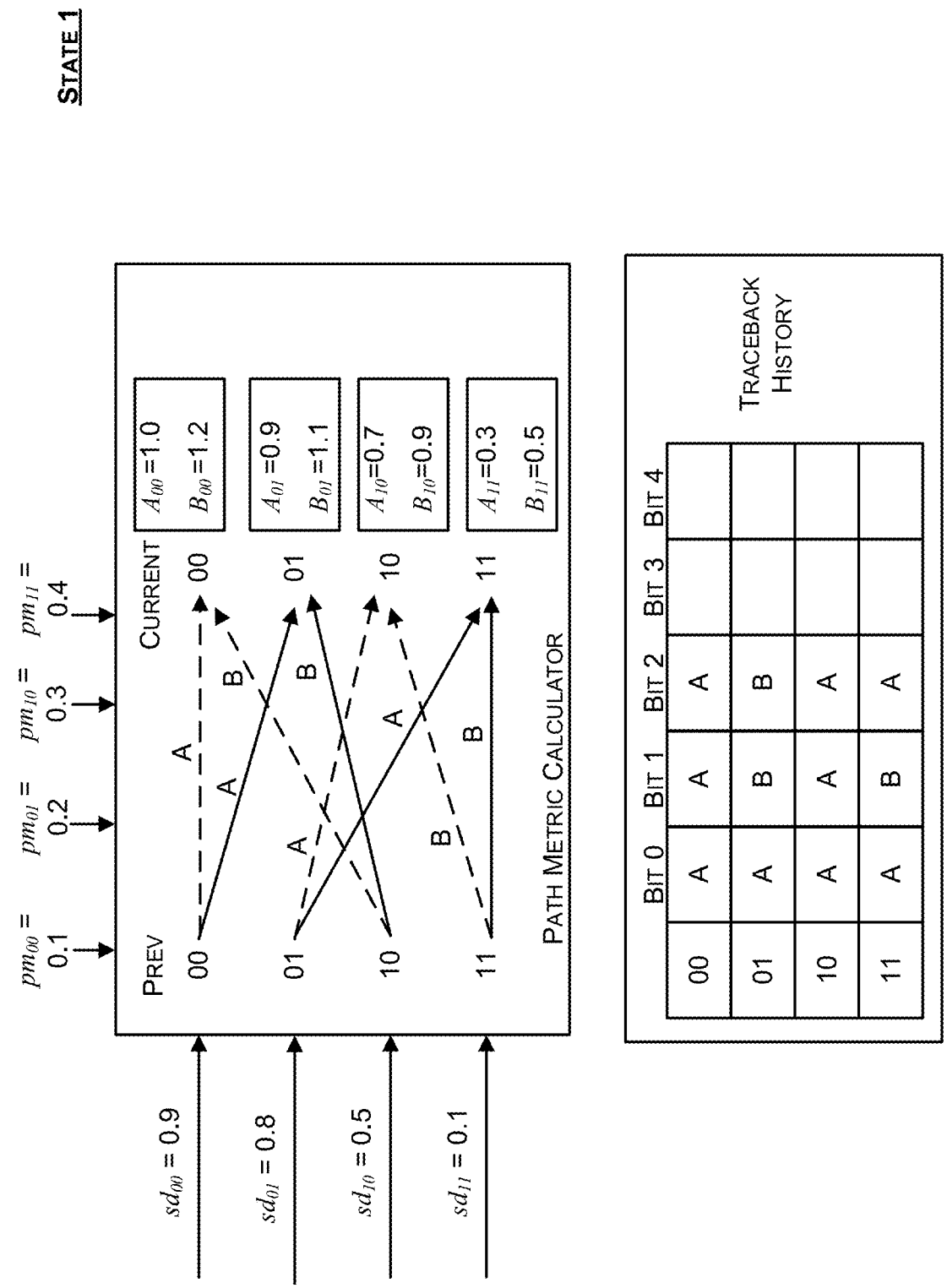
FIG. 8 is schematic diagram illustrating a first example state of the Viterbi decoder of FIG. 7.
Figure 9:
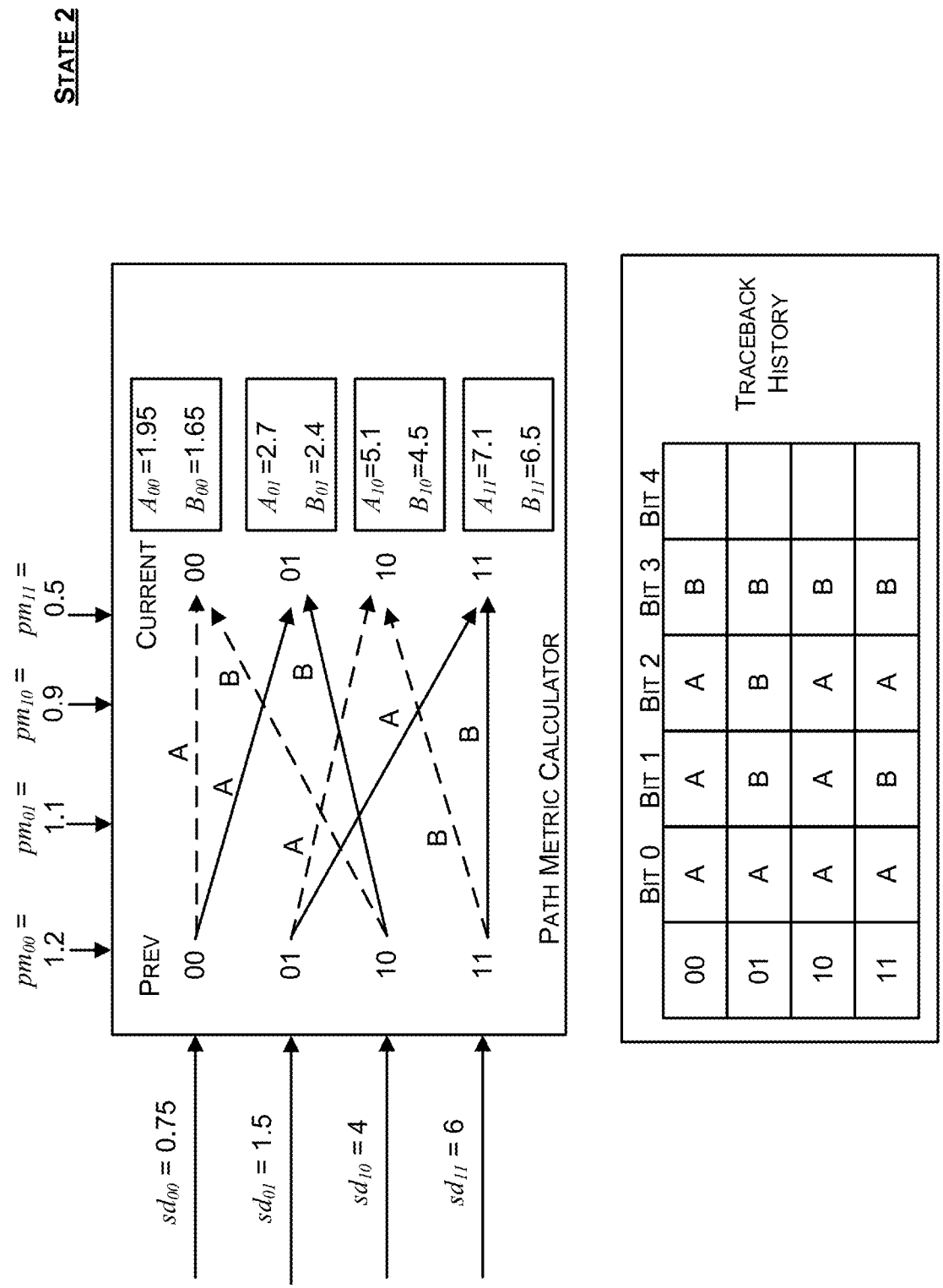
FIG. 9 is a schematic diagram illustrating a second example state of the Viterbi decoder of FIG. 7.
Figure 10:
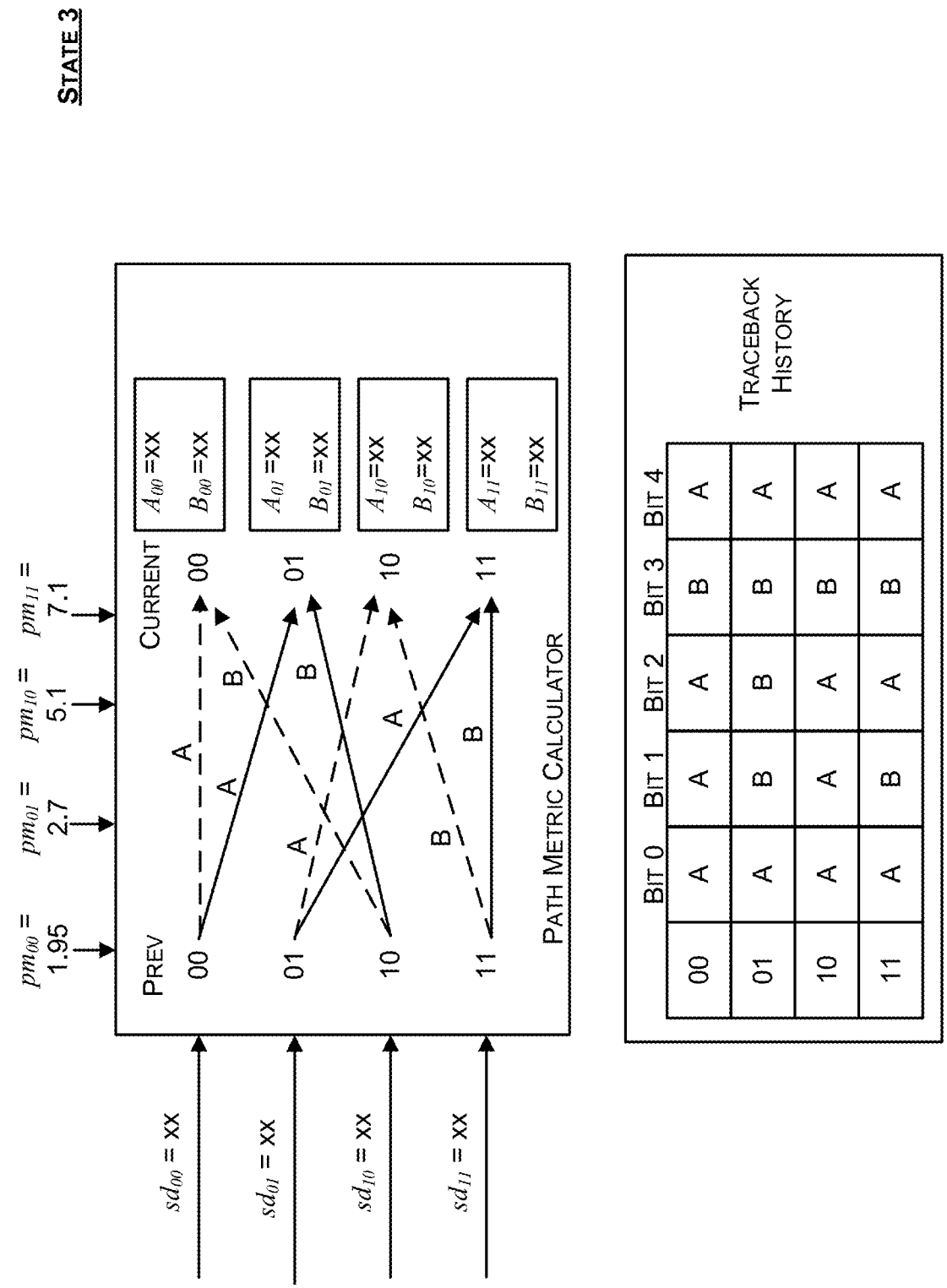
FIG. 10 is a schematic diagram illustrating a third example state of the Viterbi decoder of FIG. 7.

Reference is now made to FIGS. 8 to 10 which illustrate an example of how the Viterbi decoder 304 of FIG. 7 may process data to generate a traceback history. Specifically FIG. 8 illustrates a first state of the Viterbi decoder of FIG. 7, FIG. 9 illustrates a second state of the Viterbi decoder of FIG. 7 that follows the first state, and FIG. 10 illustrates a third state of the Viterbi decoder of FIG. 7 that follows the second state.

In the first state (FIG. 8) the path metrics $pm_{00}$, $pm_{01}$, $pm_{10}$ and $pm_{11}$ for the previous 00, 01, 10 and 11 states are 0.1, 0.2, 0.3 and 0.4 respectively; and the soft decision values $sd_{00}$, $sd_{01}$, $sd_{10}$ and $sd_{11}$ from the multi-symbol detector corresponding to the 00, 01, 10 and 11 current states are 0.9, 0.8, 0.5, and 0.1 respectively. In accordance with equations (1) to (8) the path metric calculator 702 calculates the new path metrics $A_{ij}$ and $B_{ij}$ as follows: $A_{00}=1.0$, $B_{00}=1.2$, $A_{01}=0.9$, $B_{01}=1.1$, $A_{10}=0.7$, $B_{10}=0.9$, $A_{11}=0.3$ and $B_{11}=0.5$. The comparison module 706 then selects the B branch for each of the 00, 01, 10 and 11 current states since the path metric for the B branch is greater than the path metric for the A branch in all cases. The comparison module 706 then updates the path metrics storage unit 704 so that the stored path metrics $pm_{00}$, $pm_{01}$, $pm_{10}$ and $pm_{11}$ are equal to the path metric of the corresponding B branch, and updates the traceback history storage unit 708 so that the B branch is recorded as the selected branch for all states for the next bit (i.e. bit 3). Specifically, as shown in FIG. 9 the path metrics $pm_{00}$, $pm_{01}$, $pm_{10}$ and $pm_{11}$ have become 1.2, 1.1, 0.9 and 0.5 respectively and the Bit 3 part of the traceback history indicates that the B branch has been selected for all states.

In the second state (FIG. 9) the soft decision values $sd_{00}$, $sd_{01}$, $sd_{10}$ and $sd_{11}$ from the multi-symbol detector corresponding to the 00, 01, 10 and 11 current states are 0.75, 1.5, 4, and 6 respectively. In accordance with equations (1) to (8) the path metric calculator 702 calculates the new path metrics $A_{ij}$ and $B_{ij}$ as follows: $A_{00}=1.95$, $B_{00}=1.65$, $A_{01}=2.7$, $B_{01}=2.4$, $A_{10}=5.1$, $B_{10}=4.5$, $A_{11}=7.1$ and $B_{11}=6.5$. The comparison module 706 then selects the A branch for each of the 00, 01, 10 and 11 current states since the path metric of the A branch is greater than the path metric for the B branch in all cases. The comparison module 706 then updates the path metrics $pm_{00}$, $pm_{01}$, $pm_{10}$ and $pm_{11}$ stored in the path metrics storage unit 704 so that they are equal to the path metric of the corresponding A branch; and updates the traceback history storage unit 708 so that the A branch is recorded as the selected branch for all states for the next bit (i.e. bit 4). Specifically, as shown in FIG. 10 the path metrics $pm_{00}$, $pm_{01}$, $pm_{10}$ and $pm_{11}$ have become 1.95, 2.7, 5.1 and 7.1 respectively and the Bit 4 part of the traceback history indicates that the A branch has been selected for all states. It can also be seen from FIG. 10 that the traceback history is now full (i.e. the history for 5 symbols have been recorded) so the traceback module 710 traces the best path through the trellis via the traceback history and outputs the bit stream corresponding thereto.

Figure 11:
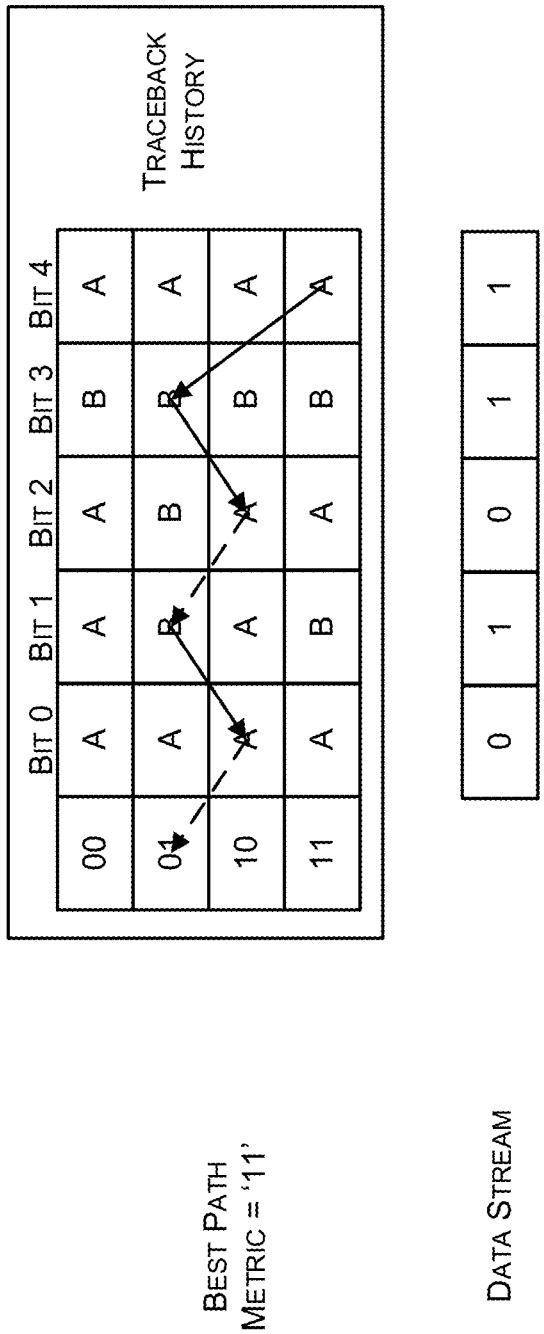
FIG. 11 is a schematic diagram that illustrates generation of an estimated symbol sequence from the data stored in the traceback history storage unit of the Viterbi decoder of FIG. 7.

Reference is now made to FIG. 11 which illustrates an example of how the traceback module may trace the best path through the trellis via the traceback history and identify an estimate of the symbol sequence corresponding thereto. Specifically, when the traceback history storage unit 708 is full (i.e. when the traceback history storage module has recorded the selected branches for M symbols (or bits when each symbol correspond to a single bit)) the traceback module 710 receives information from the comparison module 706 indicating the current state with the 'best' path metric. For example, in FIG. 11 the traceback module receives information indicating that the state '11' currently has the best path metric. The traceback module 710 then traces the path through the trellis that ends with state '11' using the traceback history. As described above, the traceback history indicates which path was taken to get to a specific state.

Specifically, the traceback history indicates that if the state '11' is the last state in the best path then the previous state of the best path is the state connected to state '11' via branch A. Branch 'A' of state '11' in the trellis is a solid line which is connected to state '01'. The solid (vs dashed) line of the branch indicates that bit 4 of the symbol sequence is likely a '1'. The previous symbol in the sequence (i.e. the symbol at bit 3) is identified by following the path from state '01' at bit 3.

The traceback history indicates that the state preceding the '01' state at bit three is the state connected to state '01' by the B branch. Branch 'B' of state '01' is a solid line which is connected to state '10' of bit 2. The solid (vs dashed) line of the branch indicates that bit 3 of the symbol sequence is likely a '1'. The previous symbol in the sequence (i.e. the symbol at bit 2) is identified by following the path from state '10' at bit 2. The traceback history indicates that the state preceding the '10' state at bit two is the state connected to state '10' by the A branch. Branch 'A' of state '10' is a dashed line which is connected to state '01' of bit 1. The dashed (vs solid) line of the branch indicates that bit 2 of the symbol sequence is likely a '0'.

The previous symbol in the sequence (i.e. the symbol at bit 1) is identified by following the path from state '01' a bit 1. The traceback history indicates that the state preceding the '01' state is the state connected to state '01' by the B branch. Branch 'B' of state '01' is a solid line which is connected to state '10' of bit 0. The solid (vs data) line of the branch indicates that the bit 1 of the symbol sequence is likely a '1'.

The previous and last symbol in the sequence (i.e. the symbol at bit 0) is identified by following the path from the state '10' at bit 0. The traceback history indicates that the state preceding the '10' state at bit 0 is the state connected to the '10' state via the A branch. Branch A of state '10' is a dashed (vs solid) line which indicates that bit 0 of the symbol sequence is likely a '0'. The traceback module 720 then outputs the likely bit stream for further processing.

Figure 12:
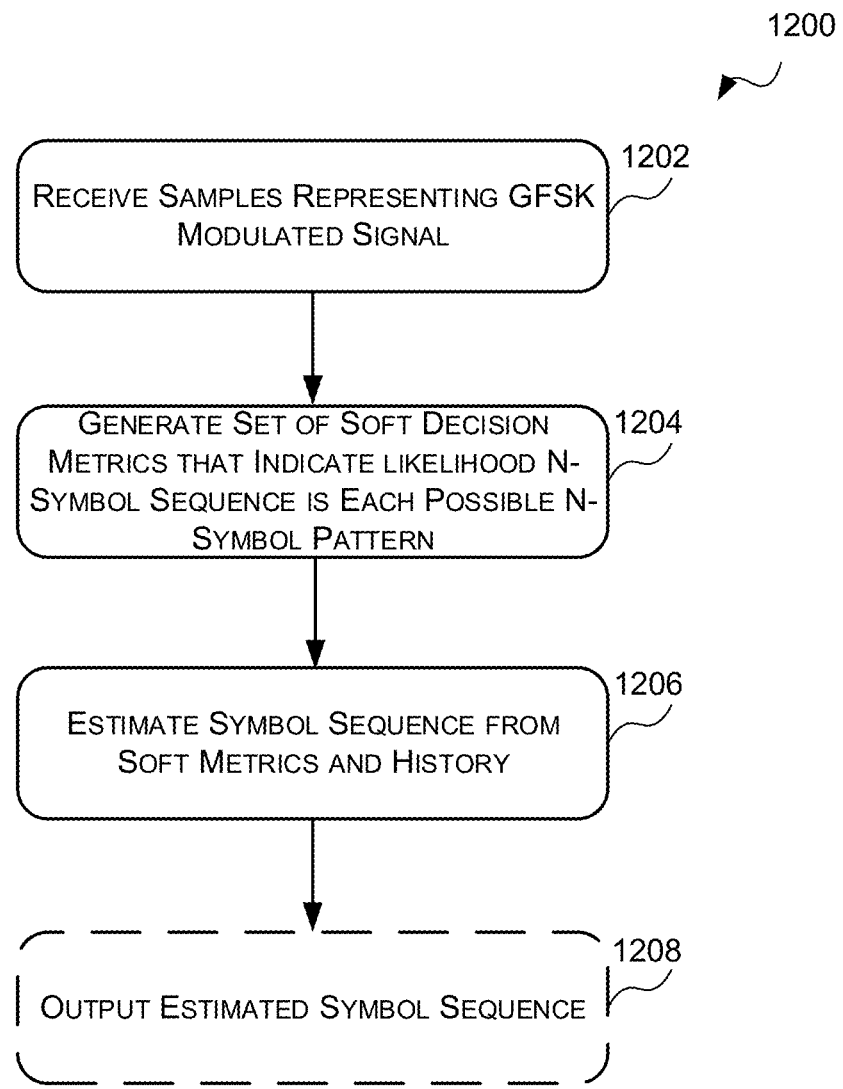
FIG. 12 is a flow diagram of an example method for decoding a GFSK signal.

Reference is now made to FIG. 12 which illustrates an example method 1200 of decoding a GFSK signal which may be implemented by the GFSK detector 300 of FIG. 3. The method 1200 begins at block 1202 where the multi-symbol detector 302 receives samples that represent a received GFSK modulated signal. At block 1204, the multi-symbol detector 302 generates, each symbol period, a plurality of soft decision values that indicate the likelihood or probability that the most recent N-symbol sequence of samples is each of the possible N-symbol patterns wherein N is equal to or greater than two. In the examples described herein the higher a soft decision value the more likely the N-symbol sequence of samples is a particular N-symbol pattern. In some cases, there may be one soft decision value for each possible N-symbol pattern that indicates the likelihood that the N-symbol sequence of samples is that possible N-symbol pattern. For example, in these cases, if N is two there will be $2^2$ possible symbol combinations or patterns thus the multi-symbol detector will generate at least four soft decision values each symbol period. In some cases, the multi-symbol detector is configured to generate the soft decision values by comparing each N-symbol sequence of the received signal to N-symbol reference patterns that represent each of the possible N-symbol combinations.

At block 1206, the Viterbi decoder 304 estimates an M-symbol sequence of the GFSK modulated signal based on the soft decision values generated by the multi-symbol detector 302 in accordance with the Viterbi decoding algorithm, wherein M is an integer greater than or equal to N. Specifically, in the examples described herein the Viterbi decoder is configured to use the soft decision values generated in a symbol period as the branch metrics for that period. For example, as described above, the soft decision value that indicates the probability or likelihood of state W may be used as the branch metric for any branch ending in state W. The Viterbi decoder 304 may output an estimate of the M-symbol sequence in the GFSK signal based on the most likely path through the trellis (block 1208).

Figure 13A:
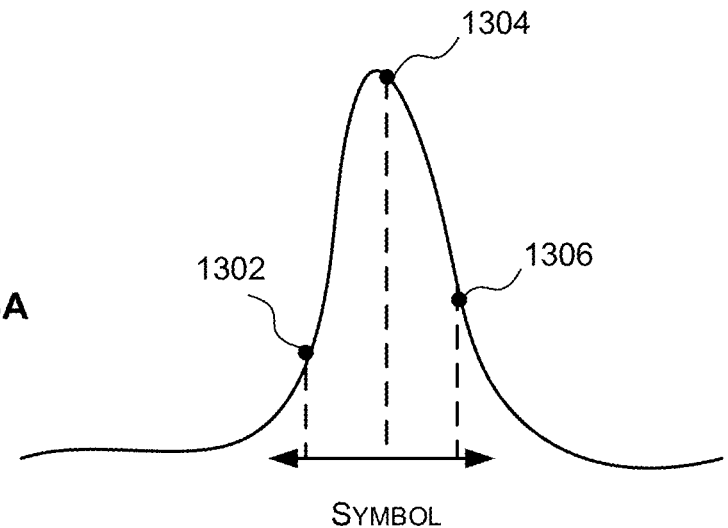
FIGS. 13A, 13B, 13C are schematic diagrams illustrating on-time, early and late sampling of a symbol.
Figure 13B:
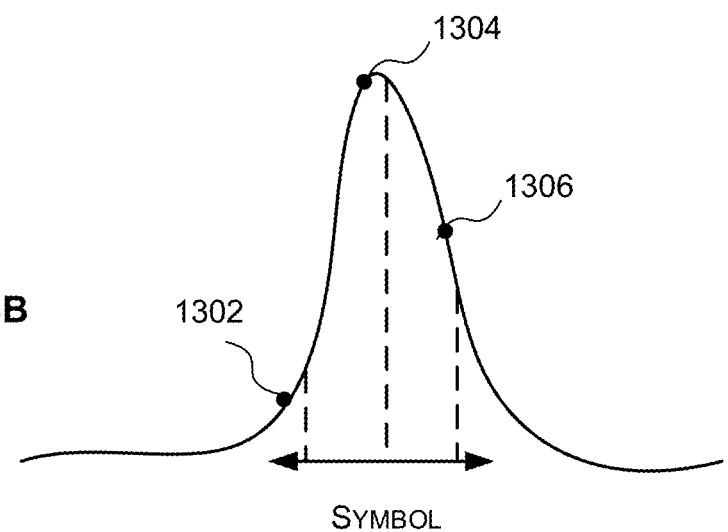
Figure 13C:
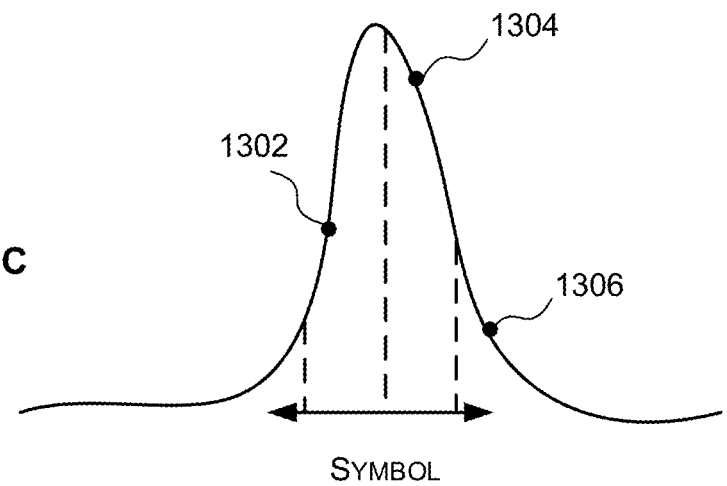

In addition, or alternatively, to generating an estimate of the received symbol sequence from the soft decision values generated by the multi-symbol detector 302, the soft decision values generated by the soft decision decoder may be used to adjust the timing of the sampling of the GFSK modulated signal. As described above, when a GFSK modulated signal is sampled there will be at least one sample per symbol (referred to as the on-time sample). Ideally the on-time sample 1302 is aligned with the centre of the symbol as shown in FIG. 13A. However, the on-time sample 1302 may be early or late with respect to the centre of the symbol as shown in FIGS. 13B and 13C respectively. When the on-time sample 1302 is early or late it is more difficult for the correlators 306, 308, 310, 312 to determine there is a match with the reference patterns. This is because the reference patterns will have been generated by sampling the ideal N-symbol sequence signal at the centre of the symbols.

Accordingly, it is advantageous to automatically detect when the sample timing is early or late and adjust the sample timing accordingly. However, it is difficult to determine from a single sample per symbol whether the sampling is early or late. Accordingly, a GFSK receiver is often configured to oversample the received GFSK signal to provide more information to determine whether the sampling is early or late. When a GFSK modulated signal is oversampled by a factor of three there will be three equally spaced samples per symbol—an on-time sample 1302 which is ideally aligned with the centre of the symbol, an early sample 1304 that precedes the on-time sample, and a late sample 1306 that follows the on-time sample.

Where the GFSK modulated signal is oversampled by a factor of three it may possible to estimate the timing error (and generate a corresponding adjustment signal) by generating three sets of soft decision values for each set of samples representing an N-symbol sequence of the GFSK modulated signal. One set of soft decision values (which may be referred to as the on-time soft decision values) indicates the probability that the N-symbol sequence is each of the possible N-symbol patterns when the on-time samples are treated as representing the centre of the symbols. This set of soft decision values may be generated by comparing the samples corresponding to an N-symbol sequence to samples of a reference pattern wherein the on-time samples are aligned with the on-time samples of the reference pattern. Another set of soft decision values (which may be referred to as the set of early soft decision values) indicates the probability that the N-symbol sequence is each of the possible N-symbol patterns when the early samples are treated as representing the centre of the symbols. This set of soft decision values may be generated by comparing the samples corresponding to an N-symbol sequence to samples of a reference pattern wherein the early samples are aligned with the on-time samples of the reference pattern. The last set of soft decision values (which may be referred to as the set of late soft decision values) indicate the probability that the N-symbol sequence is each of the possible N-symbol patterns when the late samples are treated as representing the centre of the symbols. This set of soft decision values may be generated by comparing the samples corresponding to an N-symbol sequence to samples of a reference pattern wherein the late samples are aligned with the on-time samples of the reference pattern.

However, the inventors have identified that a much more accurate estimate of the sample timing error may be achieved by providing each set of soft decision values to separate Viterbi decoders and identifying the sample timing error (and adjusting the sampling timing according) based on the path metrics generated by the Viterbi decoders.

Accordingly, described herein are methods and systems for adjusting the sample timing of a GFSK modulated signal using a plurality of Viterbi decoders. In the methods and systems described herein the GFSK modulated signal is oversampled by at least a factor of three so that there are at least three samples per symbol. A multi-symbol detector is then configured to generate at least three sets of soft decision values for each set of samples representing an N-symbol sequence. Each set of soft decision values indicates the probability or likelihood that the N-symbol sequence is each of the possible N-symbol combinations when a different one of the at least three samples is treated as a centre of the symbol. Each set of soft decision values is provided to a different Viterbi decoder which is configured to generate a path metric for each possible N-symbol combination or pattern from the set of soft decision values according to a Viterbi decoding algorithm. A timing adjustment module is then configured to generate a timing adjustment signal based on the path metrics generated by the Viterbi decoders.

The ability to generate such a timing adjustment signal is particularly useful where there is no training symbol, such as in Bluetooth® or Bluetooth® LE systems; and/or where the message length M is long, and the sample timing may drift throughout the message. The method of generating a timing adjustment signal described herein can even work for systems with very low signal-to-noise ratio (SNR) where other methods of generating a timing adjustment signal directly from the received GFSK modulated signal may generate a noisy timing adjustment signal. In other words, the method of generating a timing adjustment signal described herein can still generate a 'good' or 'clean' timing adjustment signal even at low SNRs.

Figure 14:
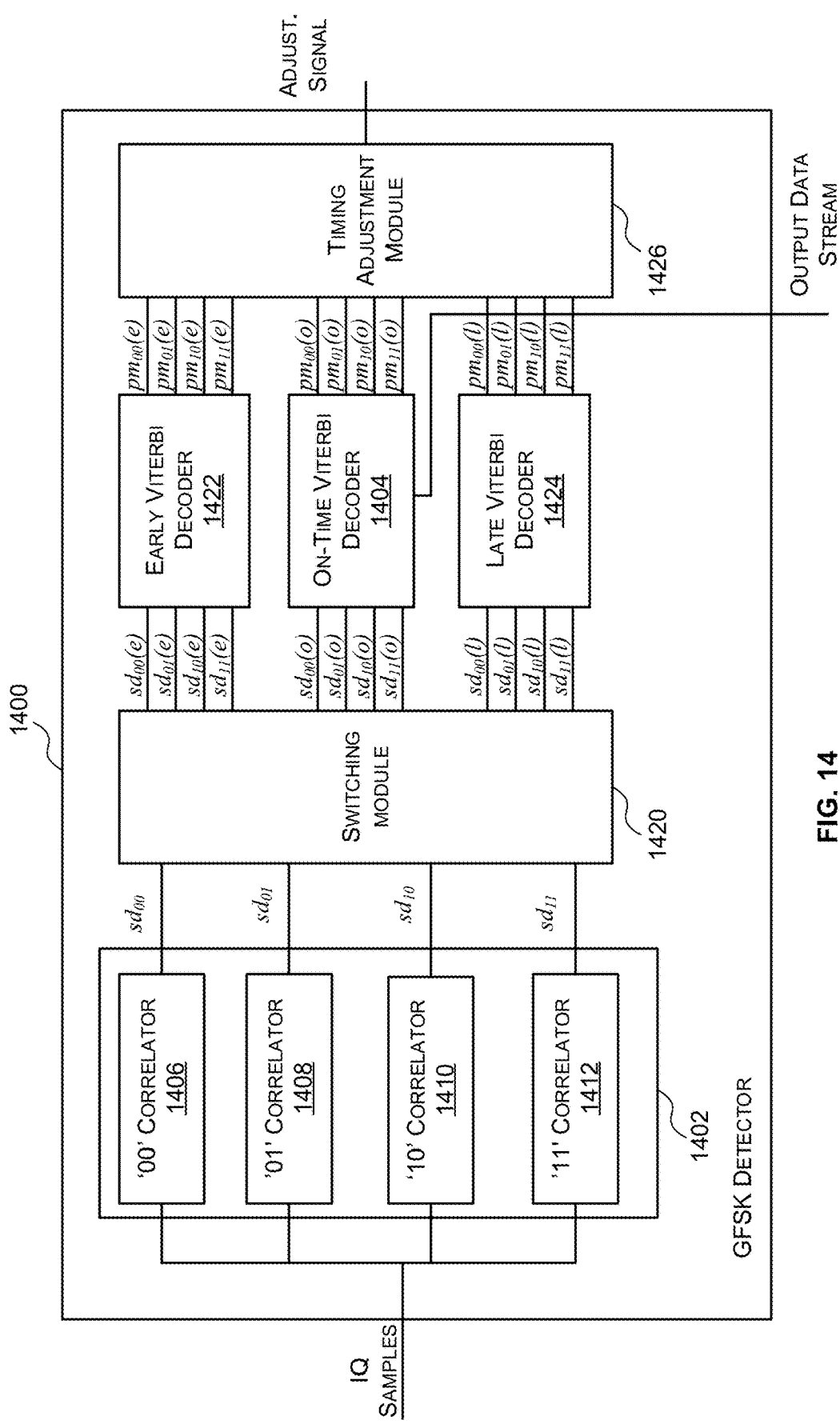
FIG. 14 is a block diagram of a second example GFSK detector in which a timing adjustment signal is generated from the soft decision values generated by the multi-symbol detector.

Reference is now made to FIG. 14 which illustrates an example GFSK detector 1400 for adjusting the sampling timing of a GFSK modulated signal by generating soft decision values at a multi-symbol detector and processing those soft decision values using a plurality of Viterbi decoders. The GFSK detector 1400 of FIG. 14 comprises a multi-symbol detector 1402, at least three Viterbi decoders 1404, 1422, 1424, a switching module 1420 and a timing adjustment module 1426. In the example of FIG. 14 there are three Viterbi decoders—an on-time Viterbi decoder 1404, an early Viterbi decoder 1422 and a late Viterbi decoder 1424, however it will be evident to a person of skill in the art that there may be more than three Viterbi decoders.

The multi-symbol detector 1402 is configured to receive a series of complex samples representing a received GFSK signal wherein there are at least three samples per symbol; and generate, for each set of samples corresponding to an N-symbol sequence, at least three sets of soft decision values. Each set of soft decision values indicates the probability or likelihood that the N-symbol sequence is each of the possible N-symbol combinations or patterns when a different one of the at least three samples is treated as a centre of the symbol.

In some cases, the soft decision values are generated by comparing the set of samples to a set of reference patterns. A particular sample of a symbol is said to be "treated as a centre of the symbol" when that sample is aligned with an on-time sample of the reference pattern for the comparison. For example, if the received GFSK modulated signal is sampled at a rate of three samples per symbol, then the complex samples representing the GFSK-modulated signal will have an early sample, an on-time sample, and a late sample per symbol; and the reference patterns will have an early sample, an on-time sample, and a late sample per symbol. In this example, when an early sample is aligned with an on-time sample of the reference pattern for the comparison the early sample is said to be treated as the centre of the symbol. Similarly when an on-time sample or a late sample is aligned with an on-time sample of the reference pattern the on-time or the late sample is said to be treated as the centre of the symbol respectively. This is illustrated in Table 1 below for a two-symbol reference pattern.

TABLE 1

| | | Samples | | | | | |
|---|---|---|---|---|---|---|---|
| Reference Pattern | | Early Sample Symbol 1 | On-Time Sample Symbol 1 | Late Sample Symbol 1 | Early Sample Symbol 2 | On-Time Sample Symbol 2 | Late Sample Symbol 2 |
| Samples of GFSK Modulated Signal | On-Time Sample = Centre Sample | Early Sample Symbol 1 | On-Time Sample Symbol 1 | Late Sample Symbol 1 | Early Sample Symbol 2 | On-Time Sample Symbol 2 | Late Sample Symbol 2 |
| | Early Sample = Centre Sample | | Early Sample Symbol 1 | On-Time Sample Symbol 1 | Late Sample Symbol 1 | Early Sample Symbol 2 | On-Time Sample Symbol 2 |
| | Late Sample = Centre Sample | On-Time Sample Symbol 1 | Late Sample Symbol 1 | Early Sample Symbol 2 | On-Time Sample Symbol 2 | Late Sample Symbol 2 | |

In some cases, the multi-symbol detector 1402 may comprise one correlator 1406, 1408, 1410, 1412 for each possible N-symbol combination that correlates the samples representing the GFSK modulated signal with a reference pattern representing one N-symbol combination. The output of the correlators provides an indication of how well the samples match the reference pattern. Typically, the more similar the samples are to the reference pattern the higher the output of the correlator. Accordingly the output of the correlators provides an estimate of the probability or likelihood that the samples are the particular N-symbol pattern. The correlators 1406, 1408, 1410, 1412 may operate in the same manner as the correlators 306, 308, 310, 312 described above with respect to FIG. 3 and/or FIG. 6.

For example, where N is equal to two and each symbol represents a single bit then there may be four correlators 1406, 1408, 1410, 1412—one correlator 1406 correlates samples of the GFSK modulated signal to a reference pattern that represents a '00' to generate soft decision values $sd_{00}$ that indicate the probability or likelihood that the samples correspond to a '00'; one correlator 1408 correlates samples of the GFSK modulated signal to a reference pattern that represents a '01' to generate soft decision values $sd_{01}$ that indicate the probability or likelihood that the samples correspond to a '01'; one correlator 1410 correlates samples of the GFSK modulated signal to a reference pattern that represents a '10' to generate soft decision values $sd_{10}$ that indicate the probability or likelihood that the samples correspond to a '10'; and one correlator 1412 correlates samples of the GFSK modulated signal to a reference pattern that represents a '11' to generate soft decision values $sd_{11}$ that indicate the probability or likelihood that the samples correspond to a '11'.

In some cases, the correlators 1406, 1408, 1410, 1412 may be configured to operate at the sample rate similar to the correlators 306, 308, 310, 312 described above with respect to FIG. 6. Specifically, as described above, in some cases, each correlator 1406, 1408, 1410, 1412 may be configured to, each sample period, correlate the most recent X samples of the GFSK modulated signal and generate a soft decision value based on the correlation that indicates the probability or likelihood that those X samples corresponds to a particular N-symbol combination, wherein X=K*N where N is the number of symbols per reference pattern and K is the number of samples per symbol. When the correlators 1406, 1408, 1410, 1412 operate in this manner, each symbol period, the correlators will output K soft metric values, and each soft metric value will be based on a different one of the samples for that symbol being treated as the centre of the symbol. Specifically, when there are three samples per symbol each correlator 1406, 1408, 1410, 1412 will output three soft decision values $sd_{ij}$ per symbol: one of the soft decision values will be based on the early samples of the GFSK modulated signal being aligned with the on-time samples of the reference pattern and thus will be referred to as the early soft decision value $sd_{ij}(e)$; one of the soft decision values will correspond to the on-time samples of the GFSK modulated signal being aligned with the on-time samples of the reference pattern and thus will be referred to as the on-time soft decision value $sd_{ij}(o)$; and one of the soft decision values will correspond to the late samples of the GFSK modulated signal being aligned with the on-time samples of the reference pattern and thus will be referred to as the late soft decision value $sd_{ij}(l)$.

The switching module 1420 is configured to provide, each symbol period, a different set of soft decision values to each of the Viterbi decoders 1404, 1422, 1424. Specifically, in the example of FIG. 14 the switching module 1420 is configured to provide, each symbol period, the set of early soft decision values $sd_{ij}(e)$ to the early Viterbi decoder 1422, the set of on-time soft decision values $sd_{ij}(o)$ to the on-time Viterbi decoder 1404, and the set of late soft decision values $sd_{ij}(l)$ to the late Viterbi decoder 1424. In some cases, the switching module 1320 may accomplish this by providing the soft decision values generated by the multi-symbol detector to the early, on-time and late Viterbi decoders 1422, 1404, 1424 in a round-robin manner. In this way, each Viterbi decoder receives every third set of soft decision values output by the multi-symbol detector 1402.

The Viterbi decoders 1404, 1422, 1424 are configured to generate, each symbol period, a path metric for each possible N-symbol combination from the received set of soft decision values according to a Viterbi decoding algorithm (VDA). Specifically, in the example of FIG. 14 the early Viterbi decoder 1422 is configured to generate, each symbol period, a path metric for each possible N-symbol combination from the set of early soft decision values; the on-time Viterbi decoder 1404 is configured to generate, each symbol period, a path metric for each possible N-symbol combination from the set of on-time soft decision values; and the late Viterbi decoder 1424 is configured to generate, each symbol period, a path metric for each possible N-symbol combination from the set of late soft decision values. In some cases, the Viterbi decoders may be configured to generate the path metrics in the same manner as the Viterbi decoder 304 of FIGS. 3, 5 and 7 to 11. However, it will be evident to a person of skill in the art that this is an example only and that in other cases the Viterbi decoders 1404, 1422, 1424 may be configured to generate the path metrics from the soft decision values according to the VDA in another manner. For example, in other cases the Viterbi decoders 1404, 1422, 1424 may be configured to generate the branch metrics from the soft decision values in a different manner.

In some cases, only one of the Viterbi decoders (e.g. the on-time Viterbi decoder 1404) may be configured to generate an estimate of the symbol sequence. In these cases, the other Viterbi decoders (e.g. the early Viterbi decoder 1422 and the late Viterbi decoder 1424) may not need to trace the best path through the trellis thus they may not comprise a traceback history storage module and/or a traceback module as described above with respect to FIGS. 7 to 11.

The timing adjustment module 1426 is configured to, each symbol period, receive a set of path metrics from each of the Viterbi decoders, and determine whether a sample timing adjustment is to be made based on the received path metrics. If it is determined that a sample timing adjustment is to be made the timing adjustment module 1426 may determine the direction and amount of the adjustment based on the received path metrics.

For example, if there is a coarse or large sampling misalignment then the maximum early or late path metric (i.e. the path metric indicating the most likely path) will be significantly larger than the maximum on-time path metric indicating that the early or late sample is closer to the centre of the symbol than the on-time path metric. Accordingly, the timing adjustment module 1426 may be configured to determine that there is a coarse misalignment if the maximum early path metric exceeds the maximum on-time path metric by a predetermined coarse threshold or if the maximum late path metric exceeds the maximum on-time path metric by at least a predetermined coarse threshold. If, however, the sampling is perfectly aligned with the symbols of the GFSK signal then the maximum early and late metrics will be substantially the same (and lower than the maximum on-time metric). If there is a small timing error, then one of the maximum early path metric and the maximum late path metrics will exceed the other by a predetermined fine threshold. Accordingly, the timing adjustment module 1426 may be configured to determine that there is a small sampling misalignment if the one of the maximum early and late path metrics exceeds the other by at least a fine threshold. An example method for generating the sample timing adjustment is described with reference to FIG. 16.

Figure 15:
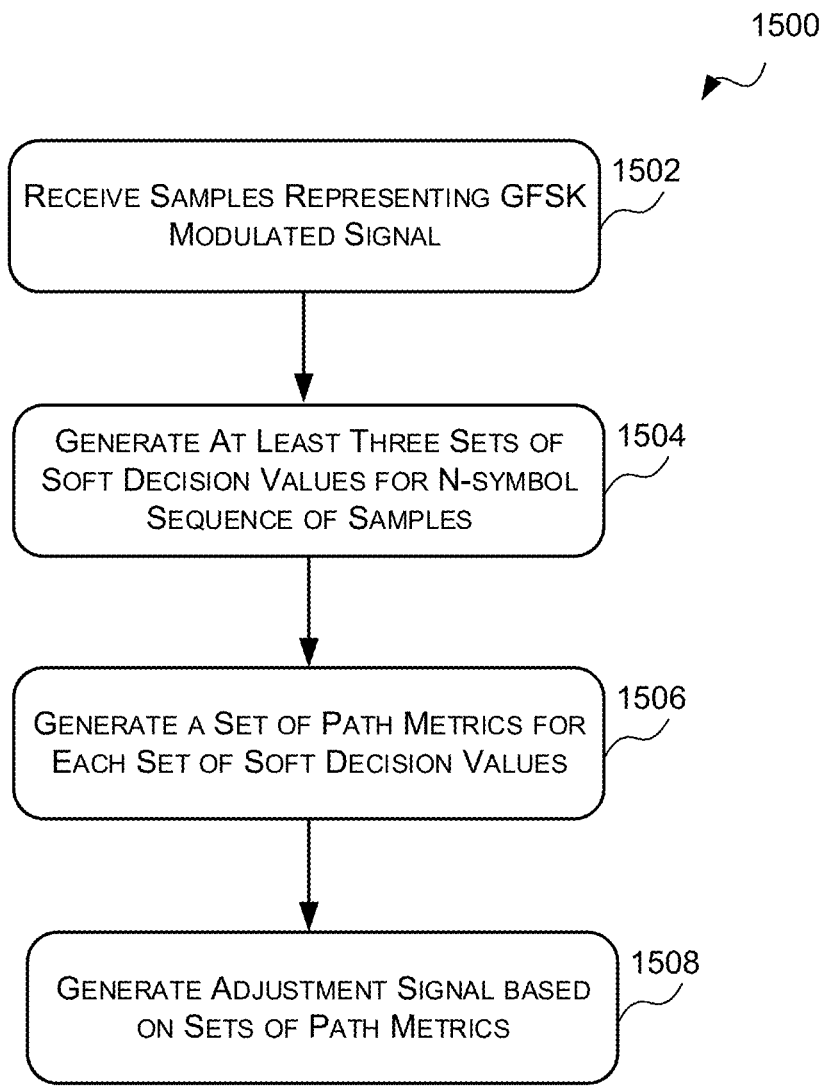
FIG. 15 is a flow diagram of an example method for adjusting the sample timing of a GFSK modulated signal.

Reference is now made to FIG. 15 which illustrates an example method 1500 for adjusting the sample timing of a GFSK modulated signal using a plurality of Viterbi decoders which may be implemented by the GFSK detector 1400 of FIG. 14. The method 1500 begins at block 1502 where the GFSK detector 1400 (e.g. multi-symbol detector 1402) receives a series of complex (e.g. IQ) samples representing a GFSK modulated signal wherein there are least three samples per symbol of the GFSK modulated signal.

At block 1504, the GFSK detector 1400 (e.g. multi-symbol detector 1402) generates, for a set of samples representing an N-symbol sequence of the GFSK modulated signal, at least three sets of soft decision values. Each set of soft decision values indicates the likelihood that the N-symbol sequence is each possible N-symbol combination based on a different one of the at least three samples of a symbol being a centre sample of the symbol. N is an integer greater than or equal to two. For example, as described above, in some cases there are three samples per symbol—an early sample, an on-time sample, and a late sample—and the at least three sets of soft decision values comprises a set of early soft decision values based on the early samples being the centre samples of the symbols; a set of on-time soft decision values based on the on-time samples being the centre samples of the symbols; and a set of late soft decision values based on the late samples being the centre samples of the symbols. In some cases, each set of soft decision values comprises one value for each possible N-symbol combination. In some cases, the at least three sets of soft decision values are generated by a plurality of correlators that are configured to correlate, each sample period, the most recent X samples with a reference pattern wherein X=K*N and K is the number of samples per symbol. There may be one correlator for each N-symbol combination that correlates the most recent X samples with a reference pattern that represent one N-symbol combination.

At block 1506, the GFSK detector 1400 (e.g. Viterbi decoders 1404, 1422, 1424) generates at least three sets of path metrics from the at least three sets of soft decision values. Each set of path metrics comprises a path metric for each possible N-symbol combination generated from one set of soft decision values according to a Viterbi decoding algorithm. For example, as described above, the at least three sets of soft decision values may comprise a set of early soft decision values, a set of on-time soft decision values and a set of late soft decision values and the GFSK detector may comprise an early Viterbi decoder that generates a set of early path metrics based on the set of early soft decision values, an on-time Viterbi decoder that generates a set of on-time path metrics based on the set of on-time soft decision values, and a late Viterbi decoder that generates a set of late path metrics based on the set of late soft decision values. In some cases, the path metrics may be generated in accordance with the VDA as described above with respect to FIGS. 3, 5 and 7-11.

At block 1508, the GFSK detector 1400 (e.g. timing adjustment module 1426) generates a timing adjustment signal based on the at least three sets of path metrics to cause a timing of the sampling of the GFSK modulated signal to be adjusted. An example method for generating a timing adjustment signal based on the at least three sets of path metrics is described below with respect to FIG. 16.

Figure 16:
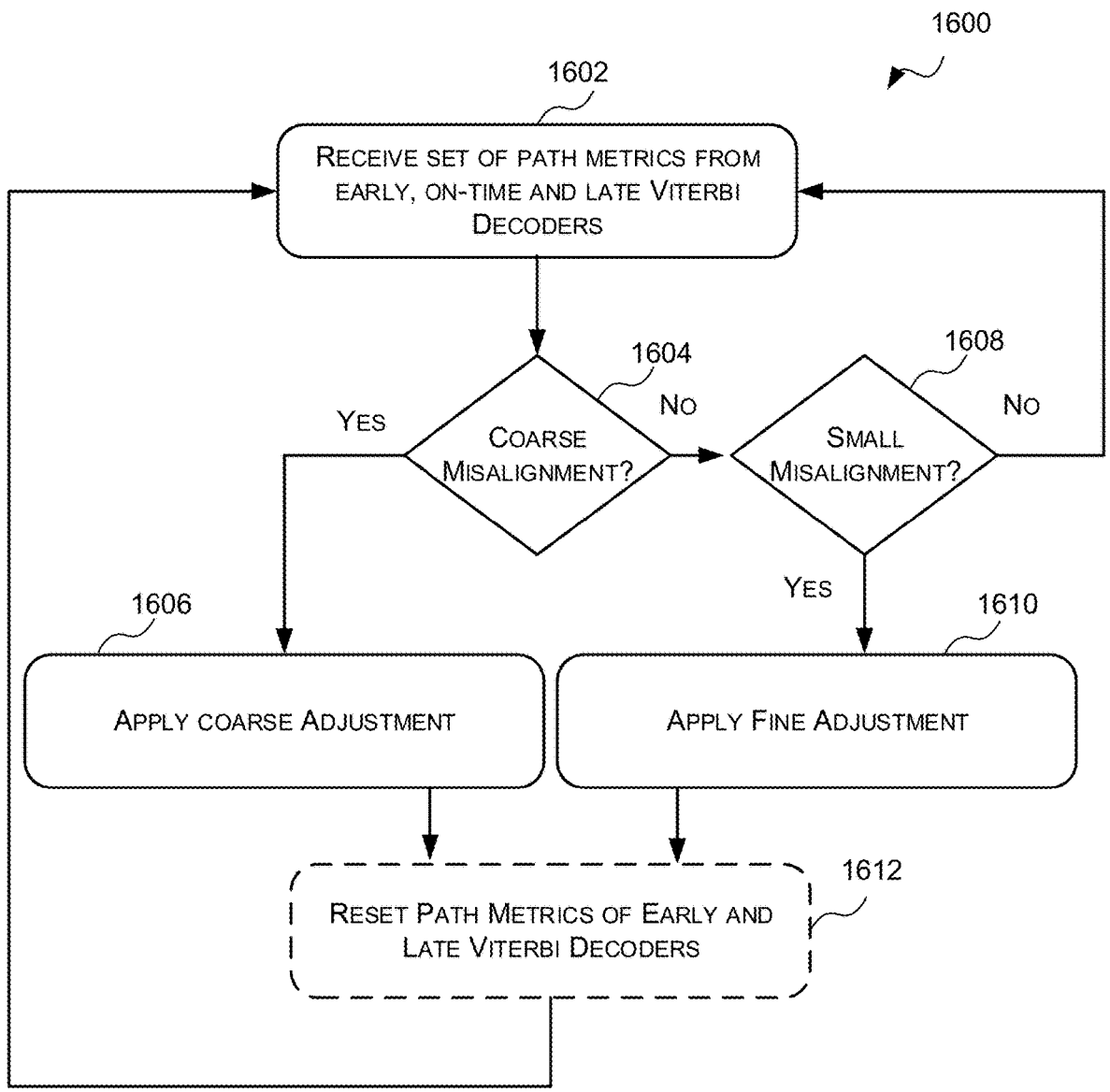
FIG. 16 is a flow diagram of an example method for generating an adjustment signal.

Reference is now made to FIG. 16 which illustrates an example method 1600 for generating a sample timing adjustment signal based on the path metrics received from the Viterbi decoders which may be implemented by the timing adjustment module 1426 of FIG. 14. The method 1600 begins at block 1602 where the timing adjustment module 1426 receives a set of path metrics from each of the Viterbi decoders 1422, 1404, 1424. Since the Viterbi decoders 1422, 1404, 1424 receive soft decision values from the multi-symbol detector at different times the path metrics from the different Viterbi decoders may arrive at the timing adjustment module 1426 at different times. Once the timing adjustment module 1426 receives a set of path metrics from each of the Viterbi decoders 1422, 1404, 1424 the method 1600 proceeds to block 1604.

At block 1604, the timing adjustment module 1426 determines, from the path metrics received from the Viterbi decoders 1422, 1404, 1424 whether or not there is a large or coarse sampling misalignment (i.e. the sampling is occurring far from the centre of the symbols). In some cases, determining whether there is a large or coarse sampling misalignment comprises identifying the maximum early, on-time and late path metrics max pm(e), max pm(o), max pm(l) as shown in equations (9), (10) and (11):

$$\max pm(e) = \max(pm_{ij}(e)) \quad (9)$$

$$\max pm(o) = \max(pm_{ij}(o)) \quad (10)$$

$$\max pm(l) = \max(pm_{ij}(l)) \quad (11)$$

Once the maximum early, on-time and late path metrics have been identified the difference between the maximum early path metric and the maximum on-time path metric, and the difference between the maximum late path metric and the maximum on-time path metric may be calculated as shown in equations (12) and (13):

$$pm\text{diff}(e) = \max pm(e) - \max pm(o) \quad (12)$$

$$pm\text{diff}(l) = \max pm(l) - \max pm(o) \quad (13)$$

If there is a coarse or large sampling misalignment then the maximum early or maximum late path metric will be significantly larger than the maximum on-time path metric indicating that the early or late sample is closer to the centre of the symbol than the on-time path metric. Accordingly, the timing adjustment module 1426 may be configured to determine that there is a coarse or large sampling misalignment if either of the path metric differences pmdiff(e) or pmdiff(l) exceed a coarse threshold. If it is determined that there is a large or coarse sampling misalignment then the method proceeds to block 1606. If, however, it is determined that there is not a large or coarse sampling misalignment then the method 1600 proceeds to block 1608.

At block 1606, after determining that there is a coarse sampling misalignment the timing adjustment module 1426 generates a coarse adjustment signal that causes a coarse adjustment to be applied to the sample timing. For example, the signal may be transmitted to a re-sampler which, in response to receiving the signal applies a coarse adjustment. In some cases, the magnitude of the course adjustment may be fixed. For example, there may be a predetermined coarse timing adjustment value. The direction of the coarse adjustment may be determined based on whether the path metrics indicate the current sampling is too early or too late. In some cases, which path metric difference exceeds the coarse threshold may indicate whether the current sampling is too late or too early. For example, if the early path metric difference exceeds the coarse threshold then the sampling is much too early and so the sample timing is delayed by, for example, adding a predetermined value to the current sampling time. In contrast, if the late path metric difference exceeds the coarse threshold then the sampling is much too late and so the sample timing is advanced by, for example, subtracting a predetermined value from the current sampling time. Once the coarse adjustment signal has been generated the method 1600 may proceed to block 1612 or it may proceed back to block 1602 where the timing adjustment module 1626 waits for the next sets of path metrics from the Viterbi decoders.

At block 1608 the timing adjustment module 1426 determines, from the path metrics received from the Viterbi decoders 1422, 1404, 1424 whether or not there is a small sampling misalignment (i.e. the sampling is occurring close to the centre of the symbols). If the sampling is perfectly aligned with the symbols, then the early and late metrics will be substantially the same. Accordingly the timing adjustment module 1426 may be configured to determine that there is a small sampling misalignment if the maximum of one of the early and late path metrics exceeds the other by a fine threshold. The fine threshold is smaller than the coarse threshold. If it is determined that there is a small sampling misalignment then the method proceeds to block 1610. If, however, it is determined that there is not a small or fine sampling misalignment then no adjustment is made and the method 1600 proceeds back to block 1602 where the timing adjustment module 1426 waits for the next sets of path metrics from the Viterbi decoders.

At block 1610, after determining that there is a small sampling misalignment the timing adjustment module 1426 generates a small adjustment signal that causes a small adjustment to be applied to the sampling time. For example, the small adjustment signal may be transmitted to a re-sampler which, in response to receiving the small adjustment signal applies a small adjustment to the sampling time. In some cases, the magnitude of the small adjustment may be fixed. For example, there may be a predetermined small timing adjustment value. The direction of the small adjustment may be determined based on whether the path metrics indicate the sampling is too early or too late. In some cases, which of the maximum early path metric and the maximum late path metric is greater may indicate whether the current sampling is too early or too late. For example, if the maximum early path metric exceeds the maximum late path metric then the sampling is slightly too early and so the sample timing is delayed by for example adding a predetermined value to the current sampling time. In contrast if the maximum late path metric exceeds the maximum early path metric then the sampling is slightly too late and so the sample timing is advanced by, for example, subtracting a predetermined value from the current sampling time. Once the small adjustment signal has been generated the method 1600 may proceed to block 1612 or it may proceed back to block 1602 where the timing adjustment module 1426 waits for the next sets of path metrics from the Viterbi decoders.

At block 1612, after an adjustment has been made to the sample timing, the timing adjustment module 1426 may reset the path metrics of the early and late Viterbi decoders 1422 and 1424 to match the path metrics of the on-time Viterbi decoder 1404. This is because the path metrics keep an infinite history and if the sample timing has been adjusted it is only important to know if there is a remaining timing offset subsequent to the adjustment. After the path metrics of the early and late Viterbi decoder 1422 and 1424 have been reset the method 1600 proceeds back to block 1602 where the timing adjustment module 1426 waits for the next sets of path metrics from the Viterbi decoders 1422, 1404, 1424.

The GFSK detectors, GFSK receivers and Viterbi decoders of FIGS. 2, 3, 7 and 14 are shown as comprising a number of functional blocks. This is schematic only and is not intended to define a strict division between different logic elements of such entities. Each functional block may be provided in any suitable manner. It is to be understood that intermediate values described herein as being formed by a GFSK detector, GFSK receiver or Viterbi decoder need not be physically generated by the GFSK detector, GFSK receiver or Viterbi decoder at any point and may merely represent logical values which conveniently describe the processing performed by the GFSK detector, GFSK receiver or Viterbi decoder between its input and output.

The GFSK detectors and GFSK receivers described herein may be embodied in hardware on an integrated circuit. The GFSK detectors and GFSK receivers described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a GFSK detector or a GFSK receiver configured to perform any of the methods described herein, or to manufacture a GFSK detector or a GFSK receiver comprising any apparatus described herein. An integrated circuit definition dataset may be, for example, an integrated circuit description.

Therefore, there may be provided a method of manufacturing, at an integrated circuit manufacturing system, a GFSK detector or a GFSK receiver as described herein. Furthermore, there may be provided an integrated circuit definition dataset that, when processed in an integrated circuit manufacturing system, causes the method of manufacturing a GFSK detector or a GFSK receiver to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a GFSK detector or a GFSK receiver will now be described with respect to FIG. 17.

Figure 17:
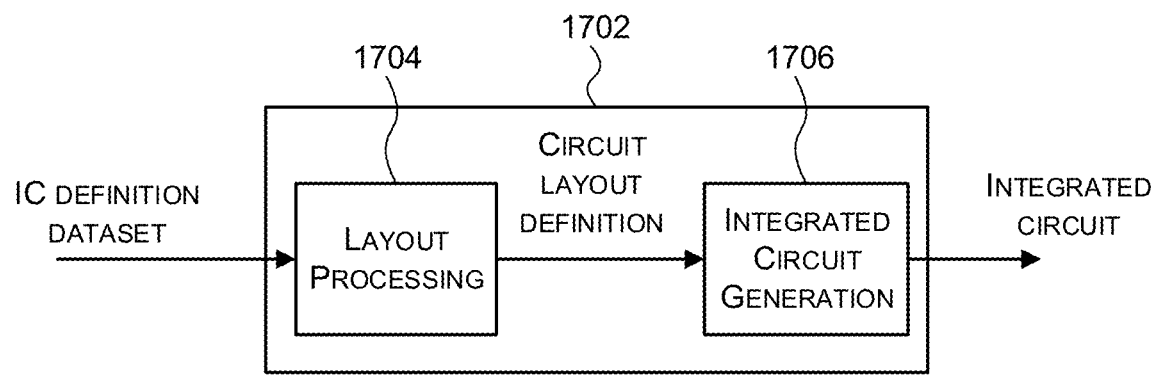
FIG. 17 is a block diagram of an example integrated circuit manufacturing system for generating an integrated circuit embodying one of the GFSK detectors or GFSK receivers described herein.

FIG. 17 shows an example of an integrated circuit (IC) manufacturing system 1702 which is configured to manufacture a GFSK detector or a GFSK receiver as described in any of the examples herein. In particular, the IC manufacturing system 1702 comprises a layout processing system 1704 and an integrated circuit generation system 1706. The IC manufacturing system 1702 is configured to receive an IC definition dataset (e.g. defining a GFSK detector or a GFSK receiver as described in any of the examples herein), process the IC definition dataset, and generate an IC according to the IC definition dataset (e.g. which embodies a GFSK detector or a GFSK receiver as described in any of the examples herein). The processing of the IC definition dataset configures the IC manufacturing system 1702 to manufacture an integrated circuit embodying a GFSK detector or a GFSK receiver as described in any of the examples herein.

The layout processing system 1704 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1704 has determined the circuit layout it may output a circuit layout definition to the IC generation system 1706. A circuit layout definition may be, for example, a circuit layout description.

The IC generation system 1706 generates an IC according to the circuit layout definition, as is known in the art. For example, the IC generation system 1706 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1706 may be in the form of computer-readable code which the IC generation system 1706 can use to form a suitable mask for use in generating an IC.

The different processes performed by the IC manufacturing system 1702 may be implemented all in one location, e.g. by one party. Alternatively, the IC manufacturing system 1702 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a GFSK detector or GFSK receiver without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 17 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 17, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A Gaussian frequency shift keying (GFSK) detector comprising:
   a multi-symbol detector configured to:
      receive a series of samples representing a received GFSK modulated signal, and
      generate, for each set of samples representing an N-symbol sequence of the GFSK modulated signal, a plurality of soft decision values that indicate the probability that the N-symbol sequence is each possible N-symbol pattern, wherein N is an integer greater than or equal to two; and
   a Viterbi decoder configured to estimate an M-symbol sequence of the GFSK modulated signal using a Viterbi decoding algorithm wherein the soft decision values for the N-symbol sequences of that M-symbol sequence are used as branch metrics in the Viterbi decoding algorithm, wherein M is an integer greater than N.

2. The GFSK detector of claim 1, wherein the plurality of soft decision values comprises a soft decision value for each possible N-symbol pattern that indicates the probability that the N-symbol sequence is that N-symbol pattern.

3. The GFSK detector of claim 1, wherein the Viterbi decoder is configured to estimate the M-symbol sequence by determining a maximum likelihood path through a trellis of valid N-symbol transitions.

4. The GFSK detector of claim 3, wherein the trellis comprises a plurality of branches, each branch represents a valid path from an N-symbol pattern at a first time instance to an N-symbol pattern at a second time instance.

5. The GFSK detector of claim 4, wherein:
   the plurality of soft decision values comprises a soft decision value for each possible N-symbol pattern that indicates the probability that the N-symbol sequence is that N-symbol pattern; and
   the Viterbi decoder is configured to, for each set of samples representing an N-symbol sequence, use the soft decision value for a particular N-symbol pattern as the branch metric for any branch that terminates in that particular N-symbol pattern.

6. The GFSK detector of claim 3, wherein the Viterbi decoder is configured to, for each set of samples representing an N-symbol sequence, generate a path metric for each possible N-symbol pattern that indicates the likelihood that the most likely path through the trellis terminates in that N-symbol pattern based on the set of soft decision metrics for that set of samples.

7. The GFSK detector of claim 1, wherein the series of samples comprises at least three samples per symbol, and the plurality of soft decision values comprises at least three sets of soft decisions values, each set of soft decision values indicating the likelihood that the N-symbol sequence is each possible N-symbol pattern based on a different one of the at least three samples of a symbol being a centre sample of the symbol.

8. The GFSK detector of claim 7, wherein:
   the Viterbi decoder is configured to estimate the M-symbol sequence by determining a maximum likelihood path through a trellis of valid N-symbol transitions;
   the Viterbi decoder is configured to, for each set of samples representing an N-symbol sequence, generate a path metric for each possible N-symbol pattern that indicates the likelihood that the most likely path through the trellis terminates in that N-symbol pattern based on the set of soft decision metrics for that set of samples; and
   the GFSK detector further comprises:
   two additional Viterbi decoders, each Viterbi decoder configured to generate a path metric for each possible N-symbol pattern according to a Viterbi decoding algorithm based on one set of soft decision values; and
   a timing adjustment module configured to generate a timing adjustment signal based on the path metrics generated by the Viterbi decoders to cause the timing of the sampling of the GFSK modulated signal to be adjusted.

9. The GFSK detector of claim 1, wherein the multi-symbol detector is configured to generate the soft decision values by comparing the samples to a plurality of reference patterns that represent each possible N-symbol pattern.

10. The GFSK detector of claim 9, wherein each reference pattern of the plurality of reference patterns are not channel corrected prior to comparing the reference patterns to the set of samples representing the N-symbol sequence.

11. The GFSK detector of claim 9, wherein the multi-symbol detector comprises a plurality of correlators, each correlator is configured to correlate the samples with one of the plurality of reference patterns to generate a portion of the soft decision values.

12. The GFSK detector claim 11, wherein each correlator is configured to, each sample period, correlate the most recent X samples to the reference pattern and generate a soft decision value based on the correlation, wherein X=K*N and K is a number of samples per symbol.

13. The GFSK detector of claim 9, wherein each reference pattern represents expected frequency patterns for one of the possible N-symbol patterns.

14. The GFSK detector of claim 1, wherein N=4.

15. The GFSK detector of claim 1, wherein the GFSK modulated signal is a Bluetooth signal or a Bluetooth LE signal.

16. A GFSK receiver comprising the GFSK detector as set forth in claim 1.

17. A method of decoding a received Gaussian frequency shift keying (GFSK) modulated signal at a GFSK receiver, the method comprising:
   receiving a series of samples representing the received GFSK modulated signal;
   generating, each symbol period of the GFSK modulated signal, a plurality of soft decision values that indicate the likelihood that a most recent N-symbol sequence of samples is each possible N-symbol pattern, wherein N is an integer greater than or equal to two; and
   estimating an M-symbol sequence of the GFSK modulated signal using a Viterbi decoding algorithm wherein, each symbol period, at least a portion of the plurality of soft decision values are used as branch metrics of the Viterbi decoding algorithm, wherein M is an integer greater than N.

18. A GFSK detector configured to perform the method as set forth in claim 17.

19. A non-transitory computer readable storage medium having stored thereon computer readable instructions that, when executed at a computer system, cause the computer system to perform the method as set forth in claim 17.

20. A non-transitory computer readable storage medium having stored thereon a computer readable description of the GFSK detector as set forth in claim 1 that, when processed in an integrated circuit manufacturing system, causes the integrated circuit manufacturing system to manufacture an integrated circuit embodying the GFSK detector.

* * * * *